US006544651B2

(12) United States Patent
Wong et al.

(10) Patent No.: US 6,544,651 B2
(45) Date of Patent: Apr. 8, 2003

(54) HIGH DIELECTRIC CONSTANT NANO-STRUCTURE POLYMER-CERAMIC COMPOSITE

(75) Inventors: Ching-Ping Wong, Berkeley Lake, GA (US); Yang Rao, Atlanta, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 56 days.

(21) Appl. No.: 09/860,856

(22) Filed: May 18, 2001

(65) Prior Publication Data

US 2002/0016396 A1 Feb. 7, 2002

Related U.S. Application Data

(60) Provisional application No. 60/205,264, filed on May 18, 2000.

(51) Int. Cl.[7] ............................................. B32B 27/38
(52) U.S. Cl. ................... 428/413; 361/321.5; 523/457; 523/458; 523/459; 524/394; 524/397; 528/92; 528/411
(58) Field of Search .................... 523/457, 458, 523/459; 524/394, 397; 58/92, 411; 428/413; 361/321.5

(56) References Cited

U.S. PATENT DOCUMENTS

| | | | |
|---|---|---|---|
| 2,801,228 A | | 7/1957 | Starck et al. |
| 3,424,699 A | | 1/1969 | Stark et al. |
| 3,624,032 A | | 11/1971 | Miyashiro et al. |
| 3,812,214 A | | 5/1974 | Markovitz |
| 4,131,715 A | | 12/1978 | Frankel |
| 4,137,275 A | | 1/1979 | Smith et al. |
| 4,224,541 A | | 9/1980 | Smith et al. |
| 4,237,242 A | | 12/1980 | Frankel |
| 4,246,161 A | | 1/1981 | Smith et al. |
| 4,254,351 A | | 3/1981 | Smith et al. |
| 4,335,180 A | | 6/1982 | Traut |
| 4,358,552 A | * | 11/1982 | Shinohara et al. ........... 428/413 |
| 4,708,989 A | | 11/1987 | Broussoux et al. |
| 4,760,296 A | * | 7/1988 | Johnston et al. ............ 174/127 |
| 5,358,775 A | | 10/1994 | Horn, III |
| 5,387,480 A | * | 2/1995 | Haluska et al. .............. 428/698 |
| 5,406,235 A | * | 4/1995 | Hayashi ........................ 333/202 |
| 5,739,193 A | | 4/1998 | Walpita et al. |
| 5,922,435 A | | 7/1999 | Lee et al. |
| 5,936,025 A | | 8/1999 | Lee et al. |
| 6,111,030 A | | 8/2000 | Hartman et al. |
| 6,133,175 A | | 10/2000 | Bethke et al. |
| 6,245,841 B1 | * | 6/2001 | Yeager et al. ................ 523/217 |

OTHER PUBLICATIONS

Yang Rao, C.P. Wong, Jianmin Qu, Effective Dielectric Constant Prediction of Polymer–ceramic Composite Based on Self–consistent Theory, Proceeding of ECTC, 50th, May 22, 2000.

Yang Rao, Jireh Yue, C.P. Wong, Material Characterization of High Dielectric Constant Polymer–Ceramic Composite for Embedded Capacitor to RF Application, IMAPS Proceedings, Mar. 2001.

Rao R. Tummala, Premjeet Chahal, Swapan Bhattacharya, Recent Advances in Integral Passives at PRC, IMAPS 35th Conference—Sweden, Sep. 1998.

Yang Rao, S. Ogitani, Paul Kohl, C.P. Wong, High Dielectric Constant Polymer–ceramic Composite for Embedded Capacitor Application, Proceeding of IMAPS, Mar. 2000.

Yang Rao, C.P. Wong, Jianmin Qu, Self–consistent Model for Dielectric Constant Prediction of Polymer–ceramic Composite, Proceeding of IMAPS, Mar. 2000, p. 126–131.

Premjeet Chahal, Rao R. Tummala, Mark G. Allen, Integrated Capacitators Using Polymer–Ceramic Composites for MCM–L, ISHM Proceedings May 1996, p. 125–132.

Premjeet Chahal, Rao R. Tummala, Mark G. Allen, Madhavan Swaminathan, A Novel Integrated Decoupling Capacitator for MCM–L Technology, ECTC, 1996, IEEE.

Herbert A. Pohl and Pohl Cancer Research Laboratory, Superdielectrics Polymers, IEEE Transactions on Electrical Insulation vol. EI–21, No. 5, Oct. 1986, IEEE.

Shurong Liang, Seung R. Chong, Emmanuel P. Giannelis, Barium Titanate/Epoxy Composite Dieletcric Materials for Integrated Thin Film Capacitors, Electric Components and Technology Conference, 1998, p. 171–175.

Dolly Sinha, P.K.C. Pillai, Ceramic–polymer composites as potential material, Journal of Materials Science Letters, vol. 8, 1989, p. 673–674, Chapman and Hall Ltd.

Shin'Ichiro Asai, Mikimasa Funaki, Hiroaki Sawa, Kazuo Kato, Fabrication of an Insulated Metal Substrate (IMS), Having an Insulating layer with a High Dielectric Constant, IEEE Transactions on Components, Hybrids, and Manufacturing Technology, Aug. 1993, vol. 16, No. 5, IEEE.

(List continued on next page.)

*Primary Examiner*—Margaret G. Moore
*Assistant Examiner*—Marc S Zimmer
(74) *Attorney, Agent, or Firm*—Todd Deveau; Charles Vorndran

(57) ABSTRACT

The present invention is directed to polymer-ceramic composites having high dielectric constants formed using polymers containing a metal acetylacetonate (acacs) curing catalyst. In particular, it has been discovered that 5 weight percent Co(III) acac can increase the dielectric constant of DER661 epoxy by about 60%. The high dielectric polymers are combined with fillers, preferably ceramic fillers, to form two phase composites having high dielectric constants. Composites having about 30 to about 90% volume ceramic loading and a high dielectric base polymer, preferably epoxy, have been discovered to have a dielectric constants greater than about 60. Composites having dielectric constants greater than about 74 to about 150 are also disclosed. Also disclosed are embedded capacitors with capacitance densities of at least 25 nF/cm$^2$, preferably at least 35 nF/cm$^2$, most preferably 50 nF/cm$^2$. Methods to increase the dielectric constant of the two phase composites having high dielectric constants are also provided.

29 Claims, 19 Drawing Sheets

OTHER PUBLICATIONS

J.D.B. Smith, Metal Acetylacetonates as Laten Accelerators for Anhydride–Cured Epoxy Resins, Journal of Applied Polymer Science, 1989, vol. 26, p. 979–986, John Wiley & Sons, Inc.

Yang Rao, S. Ogitani, Paul Kohl, and C.P. Wong, Novel High Dielectric Constant Nano–structure Polymer–ceramic Composite for Embedded Capacitor Application, Proceeding of ECTC, $50^{th}$, May 22, 2000.

* cited by examiner (a)

(b)

(c)

(a)

(b)

HIGH DIELECTRIC CONSTANT NANO-STRUCTURE POLYMER-CERAMIC COMPOSITE

CROSS-REFERENCE TO RELATED APPLICATION AND CLAIM OF BENEFIT

This application claims priority to, and the benefit of, U.S. Ser. No. 60/205,264 entitled "High Dielectric Constant Nano-Structure Polymer-Ceramic Composite" filed on May 18, 2000, by Ching-Ping Wong and Yang Rao.

BACKGROUND OF THE INVENTION

1. Technical Field

The present invention relates generally to the field of epoxy-ceramic polymer composites and specifically to the field of epoxy-ceramic polymer composites having high dielectric constants which are suitable for use in forming capacitors.

2. Related Art

New materials with high dielectric constants and low loss tangents are needed in the electronics industry for use at high frequencies and as a means to enable further miniaturization. In a typical electronic system today, the number of discrete passives, non-active electrical elements, outnumbers the active integrated circuits (ICs) by several times and can occupy more than 70% of the real estate of substrate. Discrete passives have become the major barrier to the miniaturization of electronic systems. Integration of passives in IC packages, however, has the following benefits: better electrical performance, higher reliability, lower cost, and improved design options.

Because of the large number of capacitors needed in modem electrical systems, integration of capacitors is of high importance. At the same time, the development of microelectronics requires decoupling capacitors with higher capacitance and shorter distance from their serving components. Table 1 shows predicted decoupling capacitor value requirements over the decade spanning 1995–2005.

TABLE 1

Capacitance (nF/cm$^2$) required for integral decoupling capacitors

| Years →<br>Product | 1995–1997 | 1998–2000 | 2001–2003 | 2004–2006 |
|---|---|---|---|---|
| Hand held | 13 | 14 | 13 | 20 |
| Computers | 39 | 43 | 51 | 72 |

Development of microelectronics has driven and will continue driving integrated circuit (IC) technology advances to higher levels. Meanwhile, electronic packaging has undergone tremendous development in all its aspects to satisfy the requirement of IC development. The evolution of electronic packaging can be categorized into three generations. The first generation of package, so called the discrete board package, which used discrete components that took more than 80% of the board area to fulfill the supporting function to IC. The second generation used technologies such as chip scale packaging (CSP) and multi-chip-module (MCM) to increase the IC efficiency to 30–40%. The third generation, system on package (SOP), will be based on single level integrated module (SLIM) technology (as shown in the FIG. 1).

SLIM employs a low cost large area organic substrate on which is defined a multiple level metal-polymer dielectric structure that provides power, ground, and controlled impedance interconnection functions together with a full range of integral passives and optoelectronics wave guide structures.

As previously noted, passives are non-active electrical elements which can be characterized in resistive, inductive and capacitive components. FIGS. 2(a)–(c) schematically shows the definition of discrete (a), integrated (b), and integral passives (c).

Among various functional passives, the ratio of decoupling capacitors can be more than 60%. On the other hand, increasing IC speed requires decoupling capacitors with higher capacitance and shorter distance from their serving components to increase switch performance. Thus integral decoupling capacitors can be a better approach in comparison to surface mounted discrete capacitors. One of the biggest constraints of organic based technology, however, is the low processing temperature required for subsequent layers. Many materials which have been reported to have high dielectric constants require processing under such high temperatures (e.g., sintering) that they are unsuitable for SLIM technology. Polymer-ceramic composites can be used in forming capacitors on organic substrates because they combine the low processing temperature of polymers and the high dielectric constant of ceramics. Chahal et al. obtained an epoxy-ceramic composite with 68% ceramic volume loading that has the dielectric constant of 74. Importantly, Chahal did not use a metal acetylacetonate as a curing catalyst for the epoxy. Normal commercial epoxy systems have a low dielectric constant of around 3–4, which hinders efforts to increase the effective dielectric constant of the composite.

Curing of epoxies is usually accomplished using a hardener and a catalyst. It is known in the art that acetylacetonates of various metals can be used for catalyzing the reaction between a polyepoxide and a polyanhydride or to catalyze the curing of an epoxide. Patents disclosing using a metal acetylacetonate to catalyze the cure of an epoxy material or a polyepoxy material mixed with a polycarboxylic acid or polyanhydride include U.S. Pat. Nos. 2,801,228, 3,424,699, 3,624,032, 3,812,214, 4,131,715, and 4,224,541.

Polymer-ceramic composites having a dielectric constant high than normal epoxy systems are described in U.S. Pat. No. 5,739,193. The disclosed composites contain thermoplastic polymers, two ceramic fillers one of which is mica, and have a dielectric constant of at least 4.0 at 1.0 GHz. High dielectric polymer-ceramic composites are generally made by combining a polymeric matrix and a ceramic filler having a dielectric constant higher than the polymeric matrix. This approach is difficult because the composites need high levels of the ceramic filler in order to achieve the desired dielectric constant while retaining rheological properties that make the composites suitable for extrusion or molding.

Materials based on polymers combined with ceramics also having dielectric constants higher than normal commercial epoxy systems are known in the art. For example, U.S. Pat. No. 4,335,180 discloses a polymer-ceramic composite comprising an anionic dispersion of poly (tetrafluoroethylene) with the particulate filler comprising titania and further having microfibrous material comprising glass microfibers. The dielectric constants were measured to be 10–11. U.S. Pat. No. 5,358,775 discloses a polmer ceramic composite having a fluoropolymer (preferably poly (tetrafluoroethylene)) filled with a particulate ceramic material (powder) which exhibits low loss, high dielectric constant ($\geq 30$) and an acceptable low thermal coefficient of dielectric constant.

A high dielectric composite in which the matrix polymer is an epoxy resin based on bisphenol F epoxy and an organic amino curing agent and in which the filler is barium titanate at a 34 volume % level has been described (S. Asai, et al., IEEE Transactions on Components, Hybrids and Manufacturing Technology, Vol. 16, No. 5, Aug., 1993, pp. 499–504). This composite is reportedly easy to process before the epoxy resins set because of the low viscosity of the epoxy prepolymer, and has dielectric constants up to about 20 and loss tangents of about 0.0165–0.0173 were observed with this composite.

An increase in capacitance can be attributed to the polarization introduced by the insulator material. There are several molecular mechanisms associated with this polarization: (a) electronic polarization; (b) atomic polarization; (c) dipole or orientation polarization; and (d) space-charge polarization. Electronic polarization is the result of dipole moments induced by the electric field. Atomic polarization results from an unsymmetrical sharing of electrons when two different atoms combine to form a molecule. Some molecules have permanent dipoles that can react with external electric field and form dipole or orientation polarization. Space-charge polarization is different from the previous three types of polarization in that it is not due to charges that are locally bound. Instead, it is produced by charge carriers, such as free ions, that can migrate for some distance throughout the dielectric. The dielectric constant or relative permittivity ($\in_r$) represents the extent of polarization provided by the dielectric material. Most often the dielectric constant is measured as the ratio of the capacitance of a parallel-plate capacitor with the insulator material compared to the capacitance of the same capacitor with air.

The relationship between the capacitance C and the dielectric constant $\in_r$ is given by the following equation:

$$C = \frac{\varepsilon_0 \varepsilon_r A}{t} \quad \text{Equation (1)}$$

where, $\in_0$ is dielectric constant of the free space (8.854× $10^{-12}$ F/m), A is the area of the electrical conductor, t is the thickness of the insulator layer, and $\in_r$ is the dielectric constant of the insulator layer. According to this relationship, the dielectric constant of insulator material should be as high as 114 in order to achieve capacitance of 20 nF/cm$^2$, assuming a thickness of 5 $\mu$m of insulate layer. Thus, developing an organic substrate compatible high dielectric constant material is a major challenge of integral capacitor technology.

Polymer-ceramic composites can be used in forming capacitors on organic substrates because they combine the processibility of polymers and the higher dielectric constant of ceramics. Polymers filled with ceramics have been studied for use as dielectric materials in thick film capacitors. Ceramic particle size has been proved to influence the effective dielectric constant of composite dramatically. The average radius of ceramic particle usually is less than 1 $\mu$m, so that the composite is called a nano-composite.

Precisely predicting the effective dielectric constant of polymer-ceramic nano-composites is very important for the design of composite materials. Many theoretical models have been proposed in the literature for simulating the electrical and mechanical properties of such composites. In most cases, composite dielectrics are chaotic or statistical mixtures (randomly dispersed systems) of several components. The true value of permittivity of a statistic composite should lie between the values determined by Equation (2) as n=1 and n=−1. In Equation (2), $\in$ is the effective dielectric constant of the composite, $v_i$ is the volume of occupied by material i, and $\in_i$ is the dielectric constant of material i.

The dielectric behavior of chaotic systems has been studied in great detail by many authors. Many generalized equations have been derived based on experimental results and theoretical derivation. The most commonly used equation is the Lichtenecker logarithmic law of mixing and is written for a two component system as shown in Equation (3). Equation (4) is a modified form of Lichtenecker equation, where k is a fitting constant subject to composite material. It is reported that k has value around 0.3 for most well-dispersed polymer-ceramic composites.

$$\varepsilon^n = \sum_{i=1}^{m} (v_i \varepsilon_i^n) \quad \text{Equation (2)}$$

$$\log\varepsilon = v_1 \log\varepsilon_1 + v_2 \log\varepsilon_2 \quad \text{Equation (3)}$$

$$\log\varepsilon = \log\varepsilon_1 + v_2(1-k)\log\left(\frac{\varepsilon_2}{\varepsilon_1}\right) \quad \text{Equation (4)}$$

The models mentioned above are generally either too simple to properly describe the polymer-ceramic nano-composite property or are merely empirical models. For example, Lichtenecker logarithmic law needs to obtain fitting factor k every time materials are changed, because k is sensitive to both polymer and ceramic materials.

BRIEF DESCRIPTION OF THE INVENTION

It has been discovered that base polymers containing a metal acetylacetonate (acacs) can be combined with additional substances, preferably ceramic fillers, to form two phase composites having high dielectric constants. Exemplary base polymers include but are not limited to epoxies. In particular, it has been discovered that 5 weight percent Co(III) acac can increase the dielectric constant of DER661 epoxy by about 60%. Weight percent equals the weight of solute divided by the weight of solution multiplied by 100. Composites having about 30 to about 90% volume ceramic loading and a high dielectric base polymer, preferably epoxy, have been discovered to have a dielectric constants greater than about 60. In an exemplary aspect of the present invention, composites having about 30 to about 90% volume ceramic loading and a high dielectric base polymer, preferably epoxy, have been discovered to have a dielectric constants greater than about 74 to about 150. In one aspect of the present invention, high dielectric constant base polymers, preferably epoxy, as a matrix, combined with ceramic fillers obtained a dielectric constant of about 98 to about 150 at a frequency of at least 10 kHz. In another aspect, the dielectric constant is greater than 100 at a frequency of at least 10 kHz. The dielectric constants of the compositions of the present invention exceed the dielectric constants of known base polymers and composites by at about 30% to about 80%.

In yet another aspect of the present invention, a prototype embedded capacitor with capacitance density of at least 25 nF/cm$^2$, preferably at least 35 nF/cm$^2$, most preferably about 50 nF/cm$^2$ using the novel high dielectric constant composites described herein is disclosed.

In other aspects of the present invention, methods for forming two phase composites having high dielectric constants include: dissolving a metal acetylacetonate into a polymer resin; adding a hardener to form a base polymer containing a metal acetylacetonate; and combining a ceramic filler with the base polymer. The volume loading of filler, preferably ceramic filler, can be about 30% to about 90%, preferably about 60 to about 85%. In a preferred aspect, the average size of the filler particles are less than 1 µm.

It is an object of the present invention to provide novel polymer-ceramic composite systems having high dielectric constants suitable for use in embedded capacitor applications.

It is still another object of the present invention to provide methods for increasing the dielectric constant of two phase composites.

It is yet another object of the present invention to provide improved embedded capacitors and methods for making said improved embedded capacitors.

Other objects, aspects, and advantages of the present invention will be apparent to those skilled in the art from a reading of the following detailed disclosure of the invention.

BRIEF DESCRIPTION OF THE FIGURES

FIG. 3(a) depicts the microstructure of two-phase composite materials. FIG. 3(b) shows the corresponding RUC embedded in the effective media.

DETAILED DESCRIPTION OF THE PREFERRED EMBODIMENTS

One current challenge in the physics of disordered materials lies in predicting the macroscopic properties of interest, e.g., permittivity, conductivity. However, relating the parameters obtained from a constantly evolving investigation area to the geometrical details of the material is not usually straightforward. The present invention concerns a composite medium composed of monodispersed ceramic of permitiivity $\in_A$ randomly placed within the epoxy of permittivity $\in_B$. The particle size of the ceramic used is very small compared to the dimension of the composite. Thus the dielectric property of the composite can be treated in terms of an effective medium whose dielectric permittivity can be obtained by a suitable averaging over the dielectric permittivity of the two constituents.

Figure 1:
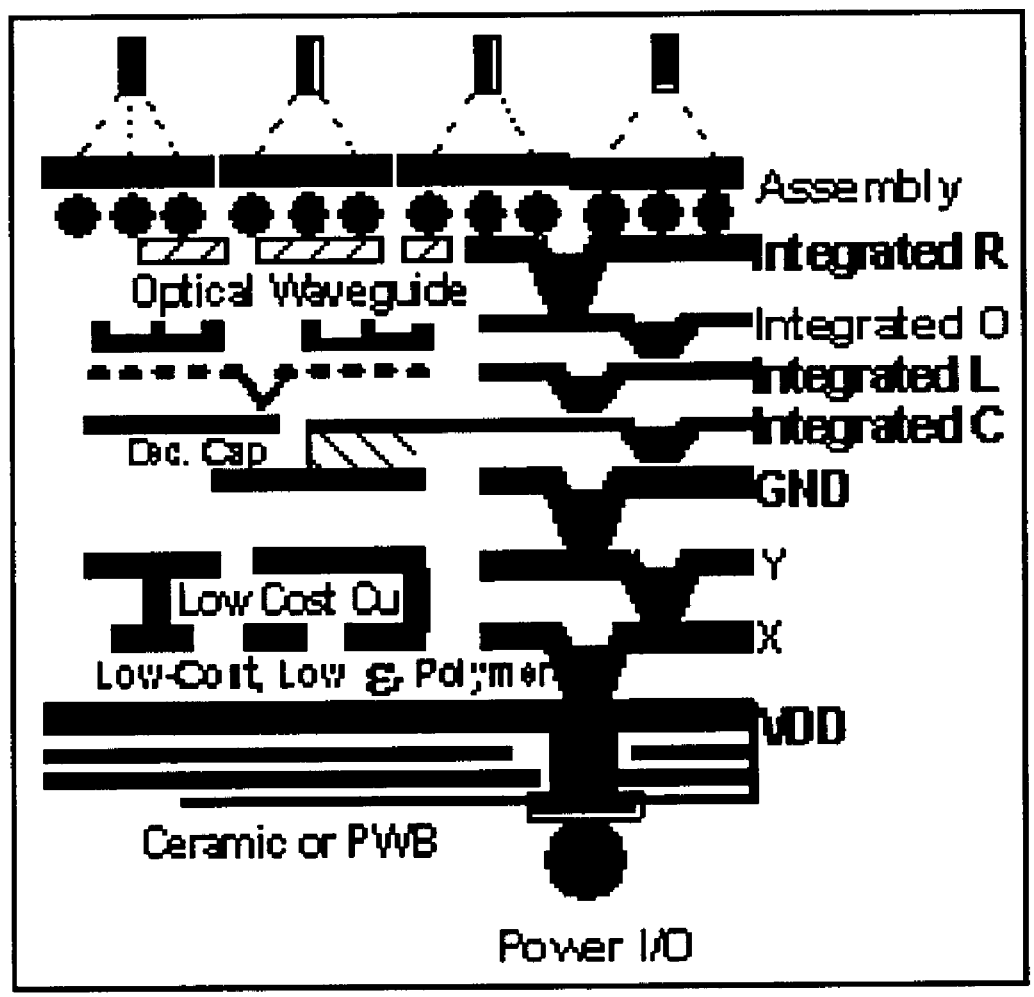
FIG. 1 is a schematic view of the single level integrated module concept.
Figure 2:
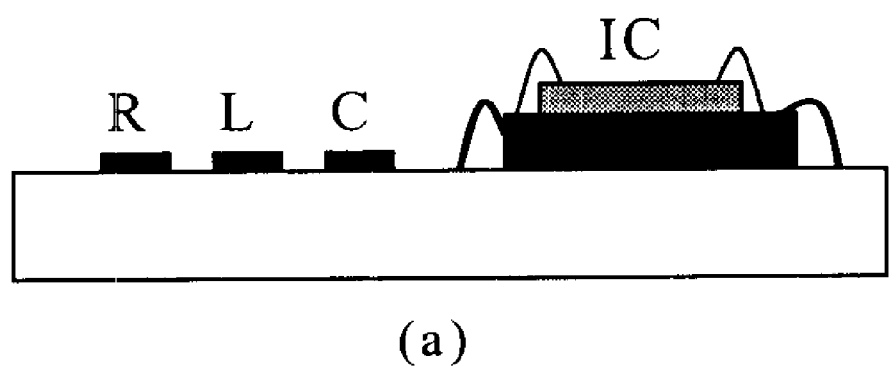
FIGS. 2(a)–(c) are diagrams of various techniques of incorporating passives (R, L and C) on a substrate, namely: (a) surface mount discrete passives; (b) integrated passives; and (c) integral passives.
Figure 2:
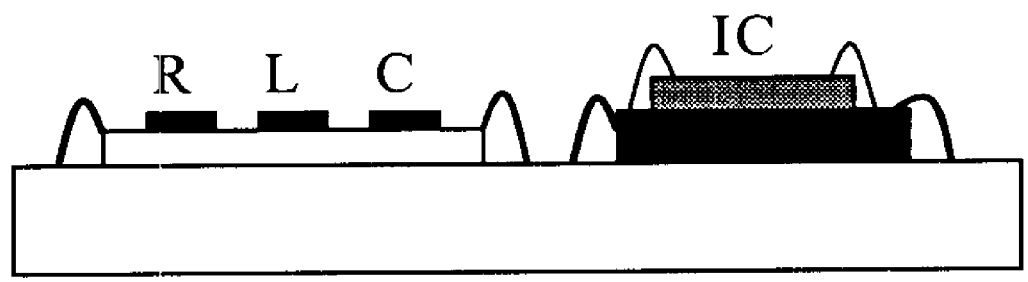
Figure 2:
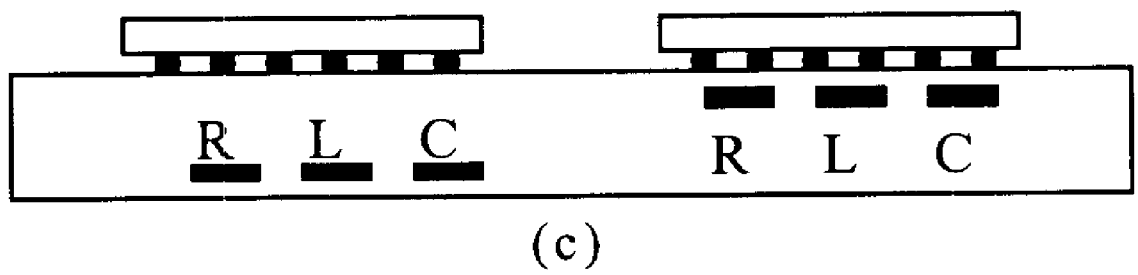
Figure 3:
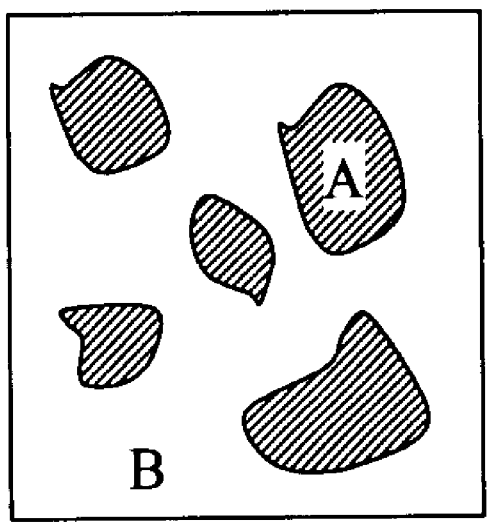
FIGS. 3(a)–(b) are diagrams illustrating two phase composites.
Figure 3:
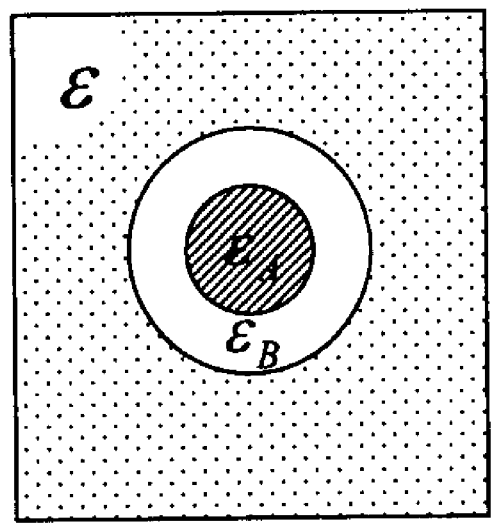

FIG. 3(a) shows a separated grain structure with particles of "A" embedded in a continuous host of "B", which is a good schematic illustration of microstructure of polymer-ceramic composite of the present invention. To account for the major features of composite microstructure, a random unit cell (RUC) is defined as a core of "A" surrounded by a concentric shell of "B", as depicted in FIG. 3(b). The RUC is taken to be embedded in an effective medium, whose properties are undefined yet. The ratio of the core volume to the shell volume is equal to $f_A$, the volume loading of ceramic.

The basic definition of an effective medium is that the RUC, when embedded in the effective medium, should not be detectable in an experiment using electromagnetic measurement. In other words, the extinction of the RUC should be the same as if it were replaced with a material characterized by $\in$. This criterion makes it fruitful to use a recently derived "optical theorem", Equation (5), for absorbing media; it relates the extinction of the spherical cell compared to that of the surrounding medium with the scattering amplitude in the direction of the impinging beam S(0) by $$C_{ext}=4\pi Re[S(0)/k^2]$$

Where $k=2\pi\in^{1/2}\lambda$ denotes the wavevector amplitude in the effective medium. From the definition of an effective medium it now follows that Cext=0, i.e., S(0)=0, which expresses the fundamental property of an effective medium. Fresnel's equations then apply at the boundaries of the effective medium. For spherical RUC, the Lorenz-Mie theory gives S(0) of a coated sphere as:

$$S(0) = i(kb)^3(\varepsilon_B - \varepsilon)(\varepsilon_A + 2\varepsilon_B) + \frac{f_A(2\varepsilon_B + \varepsilon)(\varepsilon_A - \varepsilon_B)}{(\varepsilon_B + 2\varepsilon)(\varepsilon_A + 2\varepsilon_B) + f_A(2\varepsilon_B - 2\varepsilon)(\varepsilon_A - \varepsilon_B)} + O[(kb)^5] \quad \text{Equation (6)}$$

The filling factor is:

$$f_A = \frac{a^3}{b^3} \quad \text{Equation (7)}$$

where a(b) is the radius of the inner (outer) sphere in the FIG. 3(b). In the small sphere case, the effective medium condition can be satisfied by setting the leading term in the Equation 6 equal to zero. This yields:

$$\varepsilon = \varepsilon_B \frac{\varepsilon_A + 2\varepsilon_B + 2f_A(\varepsilon_A - \varepsilon_B)}{\varepsilon_A + 2\varepsilon_B - f_A(\varepsilon_A - \varepsilon_B)} \quad \text{Equation (8)}$$

Figure 4:
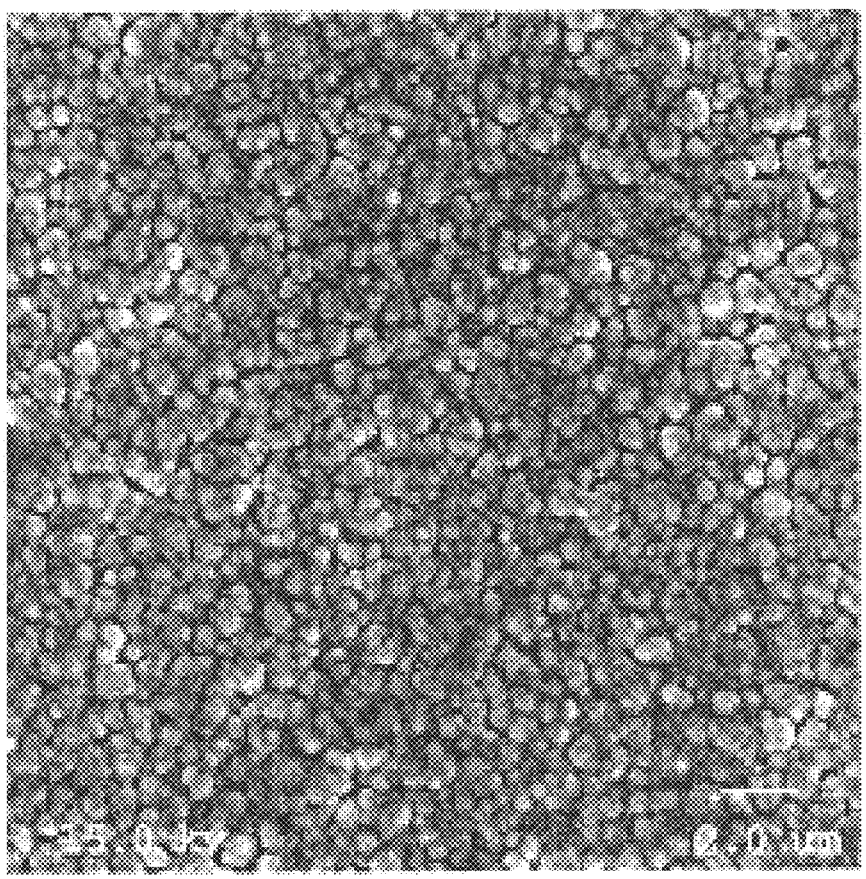
FIG. 4 is a scanning electron micrograph of composite-II with ceramic volume loading of 70%.

Similarly, EMT formula for ellipsoidal RCU can be obtained using Bruggeman theory:

$$\frac{\varepsilon - \varepsilon_B}{\varepsilon_B + (\varepsilon - \varepsilon_B)L^B} = f_A \frac{\varepsilon_A - \varepsilon_B}{\varepsilon_B + (\varepsilon_A - \varepsilon_B)L^A} \quad \text{Equation (9)}$$

where $L^A$, $L^B$ are the depolarization factor of "A" and "B", respectively. In the real nano-composite, the shape of ceramic particles is very irregular, shown in FIG. 4.

To account for the morphology of ceramic particles, a shape factor n is introduced to generalize the Equation (9) to:

$$\varepsilon = \varepsilon_B \left[ 1 + \frac{f_A(\varepsilon_A - \varepsilon_B)}{\varepsilon_B + n(1 - f_A)(\varepsilon_A - \varepsilon_B)} \right] \quad \text{Equation (10)}$$

Equation (10) is the EMT model for the effective dielectric constant prediction of polymerceramic nano-composite. The only restriction of using this model is that the particle size should be very small, which is suitable to nano-composite.

The polymer is formed using a metal acetylacetonate as a curing catalyst. The metal acetylacetonate is dissolved into a base polymer, and a hardener is added to complete the polymerization process. Suitable base polymers include but are not limited to base polymer resins, and in particular epoxies, polyimides, and cyanate esters. Suitable epoxies include but are not limited to cycloaliphatic epoxy and bisphenol-A epoxy. Exemplary base polymer resins include but are not limited to: 3,4-epoxycyclohexylmethyl-(3,4-epoxy) cyclohexane carboxylate (sold under the trademarks ERL 4221 by Union Carbide Plastics Company or Araldite CY 179 by Ciba Products Company); bis(3,4-epoxy-6-methylcyclohexylmethyl)adipate (sold under the trademarks ERL 4289 by Union Carbide Plastics Company or Araldite CY 178 by Ciba Products Company); vinylcyclohexene dioxide (ERL 4206 made by Union Carbide Plastics Company); bis(2,3-epoxycyclopentyl)ether resins (sold under the trademark ERL 4205 by Union Carbide Plastics Company); 2-(3,4-epoxy) cyclohexyl-5,5-spiro (3,4-epoxy)-cyclohexane-m-dioxane (sold under the trademark Araldite CY 175 by Ciba Products Company); glycidyl ethers of polyphenol epoxy resins, such as liquid or solid bisphenol A diglycidyl ether epoxy resins (such as those sold under trademarks as Epon 826, Epon 828, Epon 830, Epon 1001, Epon 1002, Epon 1004, etc., by Shell Chemical Company); phenol-formaldehyde novolac polyglycidyl ether epoxy resins (such as those sold under the trademarks DEN 431, DEN 438, and DEN 439 by Dow Chemical Company); epoxy cresol novolacs (such as those sold under the trademarks ECN 1235, ECN 1273, ECN 1280 and ECN 1299 by Ciba Products Company); resorcinol glycidyl ether (such as ERE 1359 made by Ciba Products Company); tetraglycidyl tetraphenylethane (Epon 1031 made by Shell Chemical Company); glycidyl ester epoxy resins such as diglycidyl phthalate (ED-5661 by Celanese Resins Company); diglycidyl tetrahydrophthalate (Araldite CY 182 by Ciba Products Company) and diglycidyl hexahydrophthalate (Araldite CY 183 made by Ciba Products Company or ED-5662 made by Celanese Resins Company); and flame retardant epoxy resins such as halogen containing bisphenol A diglycidyl ether epoxy resins (e.g., DER 542 and DER 511 which have bromine contents of 44–48 and 18–20%, respectively, and DER 661 all of which are made by Dow Chemical Company). Epoxy resins suitable for use in the present invention are well known in the art and are set forth, for example, in many patents including U.S. Pat. Nos. 2,324,483, 2,444,333, 2,494,295, 2,500,600 and 2,511,913.

Heat can be applied to facilitate dissolving the metal acetylacetonate into the polymer resin. In preferred embodiments, the amount of metal acetylacetonate is from about 1 to about 5 weight percent. Suitable metal acetylacetonates include but are not limited to transition metal acetylacetonates, a lanthanide acetylacetonates, an actinide acetylacetonates, and an alkaline earth metal acetylacetonates and combinations thereof. Preferred metal acetylacetonates are those that dissociate at temperatures below the curing temperature of the specific polymer. Exemplary acetylacetonates include but are not limited to cobalt(II) acetylacetonate and cobalt(III) acetylacetonate or a combination thereof. Any transition metal acetylacetonate may be used, including those of aluminum, cadmium, cerous, chromic, cobaltic, cobaltous, cupric, ferric, ferrous, hafnium, indium, lead, manganic, manganous, molybdenum, molybdenyl, nickel, palladium, platinum, thorium, titanium, tungstyl, uranyl, vanadium, vanadyl, zinc, and zirconium. Acetylacetonates of the rare earth elements, scandium, cerium, yttrium, lanthanum, praseodymium, neodynium, samarium, europium, gadolinium, terbium, dysprosium, holmium, erbium, thulium, ytterbium, and lutetium are known and can be expected to be useful in the practice of the present invention.

In still another embodiment, a two phase composite is provided comprising a base polymer, preferably an epoxy, containing a metal acetylacetonate, preferably Co(III) or Co(II) acetylacetonate or a mixture thereof, dispersed therein; and a ceramic filler, wherein the composite has a mean dielectric constant of at least 60, preferably greater than 74. The base polymer is selected from the group consisting of an epoxy, preferably cycloaliphatic or bisphenol A, a polyimide, and a cyanate ester or a mixture thereof. Preferred ceramic fillers include lead magnesium niobate-lead titanate or $BaTiO_3$ or a combination thereof. In one embodiment, the average particle size is less than 1 $\mu$m. The volume loading of filler, preferably ceramic filler, can be about 30% to about 90%, preferably about 60 to about 85%. Ceramic means a compound of metallic and nonmetallic elements, for which the interatomic bonding is predominantly ionic. In another embodiment, the polymer-ceramic composite has a dielectric constant of greater than 74 at a frequency of at least 10 kHz. In an exemplary embodiment, the polymer-ceramic composite has a dielectric constant of greater than 100 at a frequency of at least 10 kHz. In still another embodiment, the polymer-ceramic composites of the present invention have a dielectric loss factor of less than about 0.02.

In another embodiment of the present invention, a two phase composite is provided comprising an organic base polymer having a metal acetylacetonate dispersed therein, and a ceramic filler wherein the ceramic filler is a combination of lead magnesium niobate-lead titanate and $BaTiO_3$ in a ratio of about 3:1 to about 4:1. In a preferred embodiment, the metal acetylacetonate is Co(II) acetylacetonate or Co(III) acetylacetonate or a combination thereof. The metal acetylacetonate can be in the range of about 1 to about 5 weight percent.

In yet another embodiment, a two phase composite is provided comprising an organic base polymer having a metal acetylacetonate dispersed therein, and a ceramic filler wherein the composite has a dielectric constant greater than 74.

It will be appreciated by those of ordinary skill in the art that a hardener suitable for use in the present invention can be any substance that promotes the polymerization of a polymer resin into the final polymer. Known hardeners include but are not limited to hexahydro-4-methylphthalic anhydride, aliphatic amines, cycloaliphatic amines, amido amines, polyamides, waterbornes, epoxy acrylates, aroflint epoxy polyesters, and aroflint polyester cross linkers. Furthermore, the resin and metal acetylacetonate mixture can be heated to facilitate dissolving the metal acetylacetonate with the polymer resin. In other embodiments, the amount of metal acetylacetonate is about 1 to about 5 weight percent.

In yet another embodiment of the present invention, a method for producing polymer-ceramic composites having high dielectric constants is disclosed comprising the step of combining a polymer containing a metal acetylacetonate dispersed therein with at least one ceramic filler. A surfactant can be added to achieve good dispersion of the ceramic fillers in the base polymer. An exemplary surfactant is phosphate ester. Other embodiments include the additional step of ball milling the polymer and ceramic filler mixture. Solvents can be added to adjust the viscosity of the ceramic filler/polymer combination. Exemplary solvents include but are not limited to N-methyl-2-pyrrolidone (NMP). The polymer-ceramic composites produced by the methods herein are also disclosed.

In yet another embodiment, a method for producing polymer-ceramic composites having high dielectric constants is disclosed comprising the steps of: heating the polymer resin containing a metal acetylacetonate such that the metal acetylacetonate breaks down releasing metal cations; adding a hardener; and combining the polymer containing a metal acetylacetone dispersed therein with at least one ceramic filler, wherein the polymer containing the metal acetylacetonate has a dielectric constant of at least 6, and wherein the polymer-ceramic composite had a mean dielectric constant of at least 60.

The present invention also includes novel embedded capacitors comprising: a silicon wafer having a first and second side, wherein the first side is coated with a first gold layer; a polymer-ceramic composite, wherein the composite contains a polymer containing a metal acetylacetone dispersed therein, and wherein the composite is layered over the first gold layer; and a second layer of gold at least partially covering the composite layer. In exemplary embodiments, the embedded capacitor is formed using epoxy as a base polymer and at least one ceramic filler. Exemplary epoxies include but are not limited to cycloaliphatic epoxy or bispheol-A epoxy. Exemplary ceramic fillers include but are not limited to lead magnesium niobate-lead titanate and $BaTiO_3$ or a combination thereof, preferably but not necessarily in a ratio of 3:1 to 4:1 respectively.

The embedded capacitors of the present invention can have a capacitance density in the range of about 25 to about 50 $nF/cm^2$. Additionally, the composites disclosed herein have dielectric constants of at least 60, preferably greater than 74. The dielectric constants can be in the range of about 60 to about 150. In another embodiment, the dielectric constants are greater than 74 to about 150 at a frequency of at least 10 kHz. In an exemplary embodiment, the dielectric constant is greater than 100 at a frequency of at least 10 kHz.

The following examples are provided to demonstrate the present invention and are not intended to limit its scope in any way.

EXAMPLE 1

Several epoxy-ceramic composites were synthesized and tested. Lead magnesium niobate-lead titanate (PMN-PT, from TAM ceramics) was chosen as ceramic filler, because of its high dielectric constant at room temperature ($\in$=17,800). A commercial epoxy (Shipley photoepoxy, $\in$=3) and a Bispheol-A epoxy, DER 661, with 5 weight percent Co(III)-acac ($\in$=4) were used as the composite matrix. The two composites will be referred as composite-I (PMN-PT+ Shipley photoepoxy) and composite-II (PMN-PT+ DER 661 with 5 weight percent Co(III)-acac). The epoxy-PMN-PT composites with different ceramic volume loading (30%, 50%, 60%, 70%, and 80%) were mixed by ball milling for 4 days. Prototype capacitors then were fabricated through the following process (shown in FIG. 5): First, a thin layer of gold (0.4 µm) was deposited on a pre-cleaned silicon wafer by dc-sputtering. Second, the epoxy-ceramic composite was spin-coated on the gold-coated wafer at 1000 rpm for 10 sec then at 3000 rpm for 10 sec. The typical thickness of composite material is around 10 µm. The samples were pre-baked at 110° C. for 10 min then cured for 1 hour at 180° C. This type of curing schedule was used to avoid the appearance of defects and also to ensure full curing of the samples. Next, a thin film gold (0.2 µm) pattern was deposited on the top surface of the film by dc-sputtering through a mask. Capacitance measurements were taken using a HP Model 4263A LCA meter at 10 kHz. Dielectric constant values were calculated from the capacitance data using Equation (1).

Table 2 lists the tested dielectric constants of all composites. Using the data of composite-I, the morphology factor n was obtained as 0.13. Then Equation 10 was used to predict the effective dielectric constant of the composite-II that used in-house epoxy formulation.

TABLE 2

Tested Dielectric Constants of Composites

| Composite (I) | Dielectric Constant | Composite (II) | Dielectric Constant |
|---|---|---|---|
| 30% | 11 | 30% | 16 |
| 50% | 23 | 50% | 35 |

TABLE 2-continued

Tested Dielectric Constants of Composites

| Composite (I) | Dielectric Constant | Composite (II) | Dielectric Constant |
|---|---|---|---|
| 60% | 36 | 60% | 51 |
| 70% | 57 | 70% | 78 |
| 80% | 49 | 80% | 82 |

Figure 6:
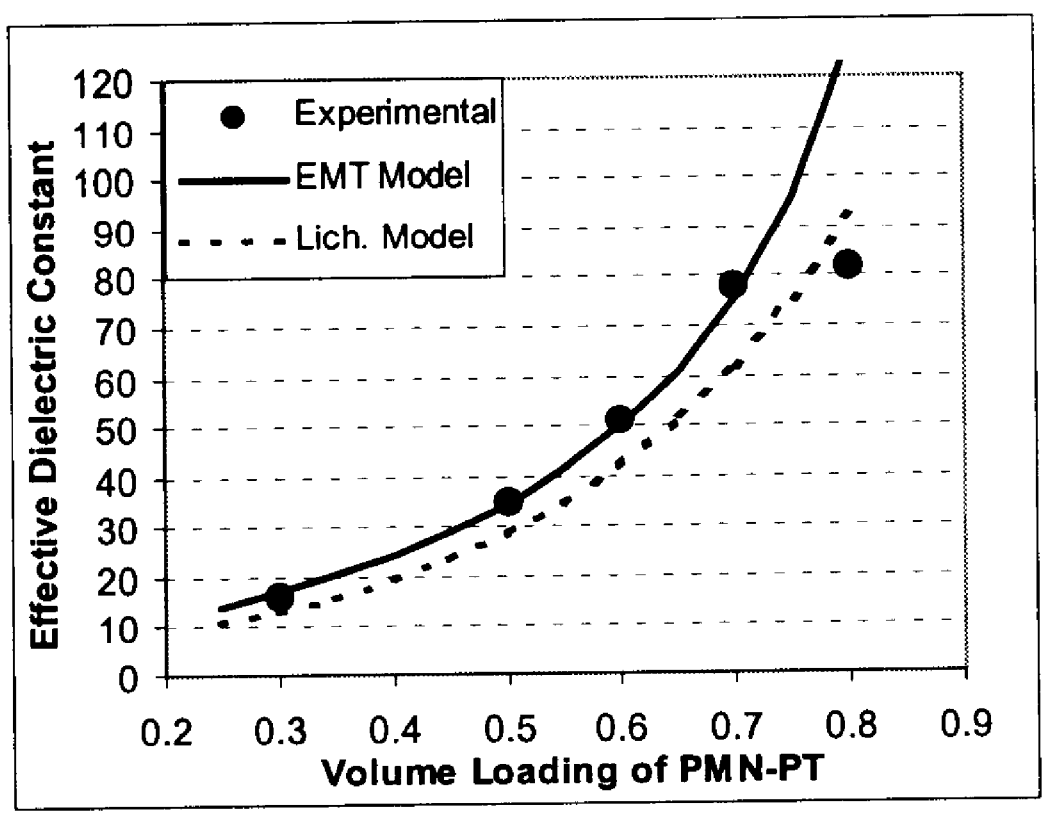
FIG. 6 is a line graph of experimental and predicted results of composite II, EMT model prediction (solid curve), Modified Lichtenecker prediction (dash curve) and experimental results (dot) of the effective dielectric constant of composite-II.

FIG. 6. compares the experimental and two numerical model predicted results of composite-II. EMT model results comply with experimental data much better than Modified Lichtenecker Model (Equation 6) results that use the fitting factor k of composite-I. It is obvious that k is sensitive to both epoxy and ceramic material. However, the ceramic morphology fitting factor n of the EMT model is only subject to ceramic material. This feature makes the EMT model easier to use.

The difference between experimental data and EMT prediction is less than 5% except for the composite with 80% ceramic volume loading, which is quite encouraging. It has been reported that almost all simulation models loose their validity when ceramic loading of composites is too high. This phenomenon may be due to the imperfect dispersal of the ceramic particles at high volume loading. Another possible reason is that air bubbles may be included in the composite at very high ceramic loading.

EXAMPLE 2

The present invention has utilized the above model for predicting high dielectric composite compositions, which are defined herein as any composite composition having a dielectric constant exceeding the previously reported maximum value of 74. Two epoxy resins were chosen for the base polymer, namely Cycloaliphatic epoxy (ERL-4221, from Union Carbide) and Bispheol-A epoxy (DER 661 from Dow). For ERL-4221, hexahydro-4-methylpthalic anhydride (HMPA, from Aldrich) was chosen as a hardener in a 1.0:0.8 mole ratio. This epoxy system has low viscosity that is helpful for high ceramic loading. DER 661 has a dielectric constant of about 3.2, is in solid form at room temperature, and it is dissolvable in N-methylpyrrolidone (referred as NMP). One of ordinary skill in the art will realize that other organic base polymers such as, for example and not by way of limitation, polyimides and cyanate esters, may also be useful as base polymers in the production of high dielectric composites as disclosed herein.

Figure 7:
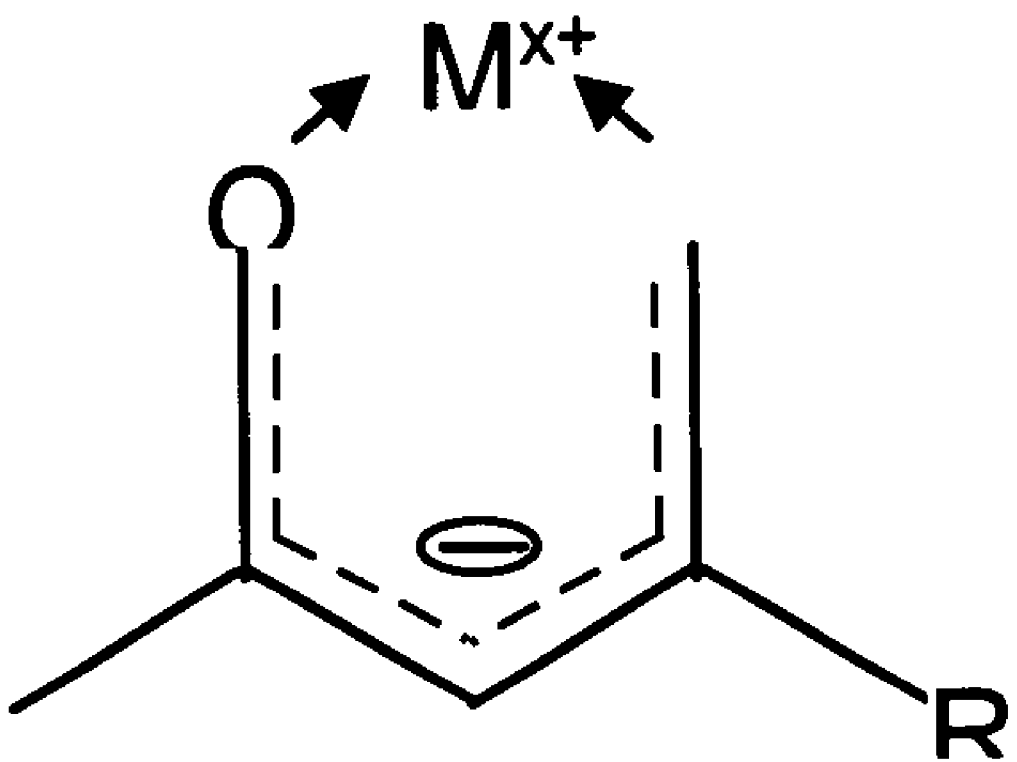
FIG. 7 is a diagram showing the general structure of metal acetylacetonate compounds. "M" denotes a metal, and "R" can be any side group.

To increase the dielectric constant, metal acetylacetonates (acacs) were chosen as additives. Metal acacs possess a β-diketonate structure as shown in FIG. 7, and are commonly used as catalysts for epoxy systems. The rationale behind choosing this particular group was that the compound would dissociate during the epoxy curing process leaving behind metal ions that would increase the polarity of polymer backbone. The degradation behavior of a series of metal acacs (including transition, lanthanide, actinide, and alkaline earth metals) was So studied using thermogravimetric analysis (TGA Model 2050, TA Instruments). Cobalt (II) acac and Cobalt(III) acac were chosen as candidates because they dissociate at temperature lower than the epoxy system cure temperature (typically <200° C). All of these compounds were purchased from Research Organic/Inorganic Chemical and Eastman Kodak.

The formulations were made by first dissolving a specific amount of metal acac additive in warm epoxy resin (70–80° C.). Once the additive was completely dissolved, the mixture was cooled to room temperature. Lastly, the hardener was added and the mixture was heated again to 70–80° C. while being stirred to achieve a homogenous blend. Table 3 gives the list of epoxy formulations.

TABLE 3

Curing Peak Temperature of Epoxy formulations

| EPOXY FORMULATION | | DER 661 | ERL 4221 |
|---|---|---|---|
| 2.5 wt % | Co(II) acac | 186° C. | 197° C. |
| 5 wt % | Co(II) acac | 184° C. | 190° C. |
| 1.5 wt % | Co(III) acac | 190° C. | 191° C. |
| 2.5 wt % | Co(III) acac | 186° C. | 185° C. |
| 5 wt % | Co(III) acac | 180° C. | 182° C. |

EXAMPLE 3

Figure 5:
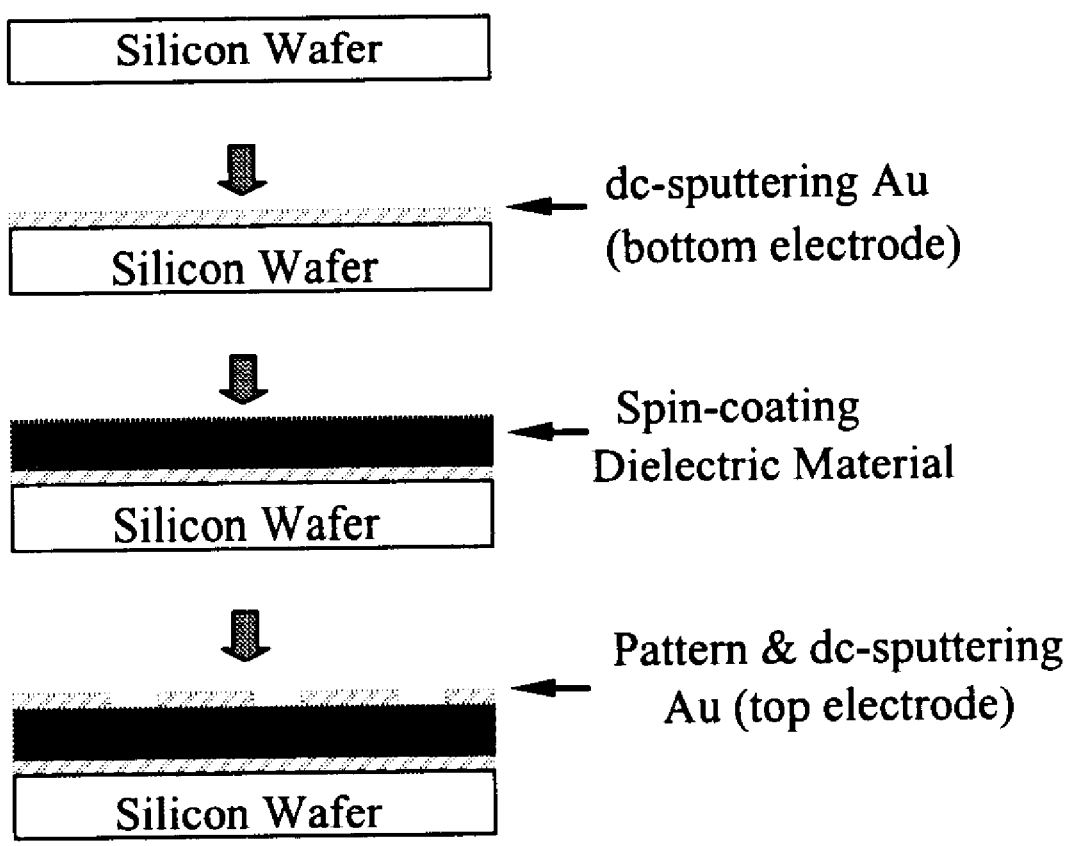
FIG. 5 is an illustration of a fabrication process of a prototype of embedded capacitors.
Figure 8:
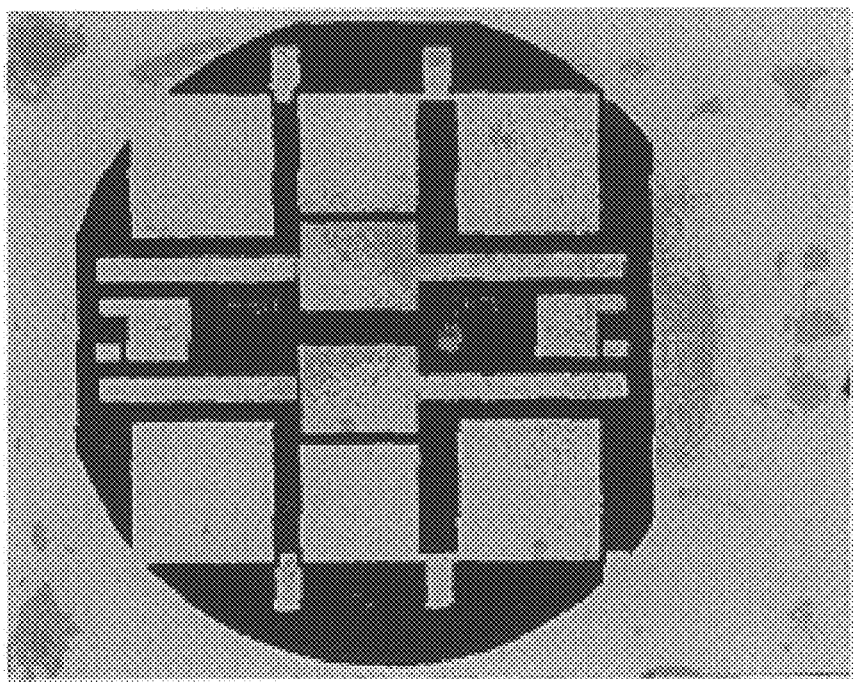
FIG. 8 is a top-view diagram of a prototype capacitor fabricated by thick film technology.

To obtain the dielectric constant values for the epoxy system, prototypes of embedded capacitors were fabricated (FIG. 8). FIG. 5 shows the fabrication process. First, a thin layer of gold (0.4 μm) was deposited on a pre-cleaned and oxidized silicon wafer by dc-sputtering. Secondly, the epoxy/ceramic composite was spin-coated on the gold coated wafer at 500 rpm for 10 sec. then at 2000 rpm for 10 sec. The typical thickness of epoxy layer is around 10 μm. The samples were pre-baked at 110° C for 10 min then cured for 1 hour at the temperatures of 10° C. lower than its curing peak temperature shown in the Table 3. This type of curing schedule was used to avoid the appearance of defects and also to ensure fall curing of the samples. Next, a thin film gold (0.2 μm) pattern was deposited on the top surface of the film by dc-sputtering through a mask. Capacitance measurements were taken using a HP 4263A LCR meter at 10 kHz. Dielectric constant values were calculated from the capacitance data using Equation 1.

Polymer-ceramic composites were developed using ERL4221 with 5.0 wt % Co(III) acac and two ceramic fillers: lead magnesium niobate-lead titanate (PMN-PT, from TAM ceramics) and $BaTiO_3$ (BT-16 from Cabot Inc.). The average particle radii of PMN-PT and $BaTiO_3$ are 0.9 μm and 0.065 μm, respectively. The volume ratio of PMN-PT and $BaTiO_3$ was chosen as 3:1 in order to obtain high pack density. Samples containing 70 and 80 vol % filler loading were ball milled for approximately 4 days at speed of 220 r/min to obtain good particle dispersion. The viscosity of sample was adjusted by the addition of solvents (NMP). The dielectric constant of the composite was also measured using the same method as polymer.

EXAMPLE 4

Figure 9:
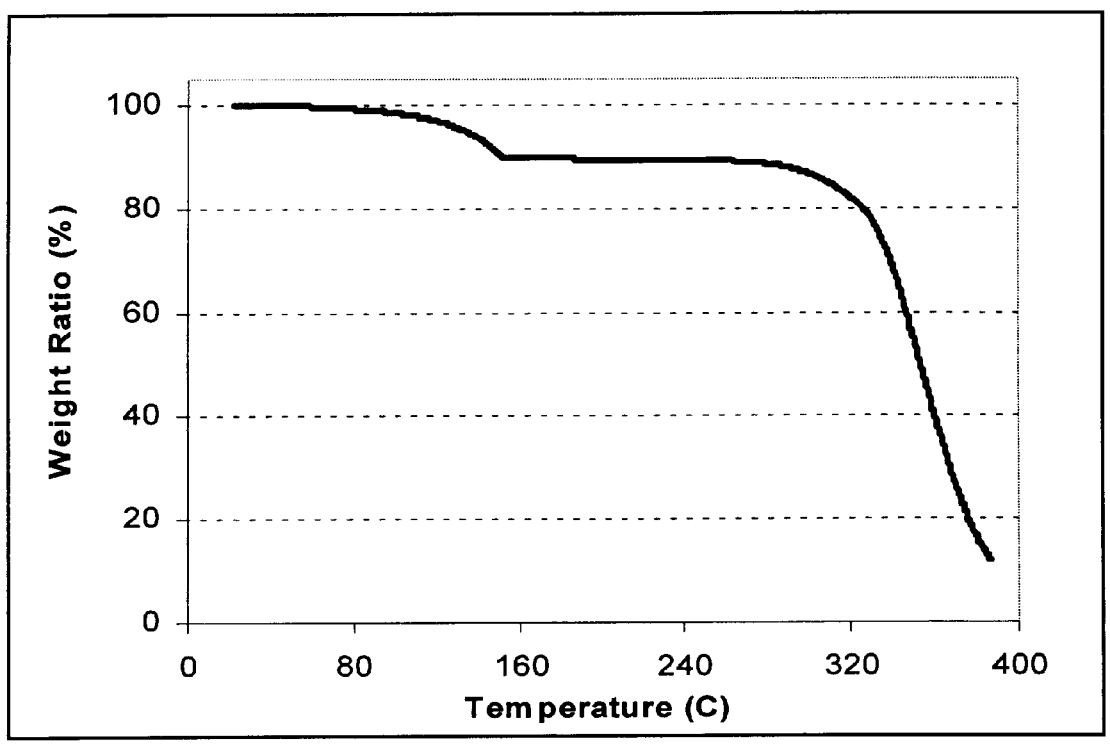
FIG. 9 is a line graph showing the thermogravimetric analysis (TGA) curve of ERL-4221 with 5 wt % Co(II) acac and hexahydro-4-methyphtahlic as a hardener in a molar ratio of 1.0:0.8.
Figure 10:
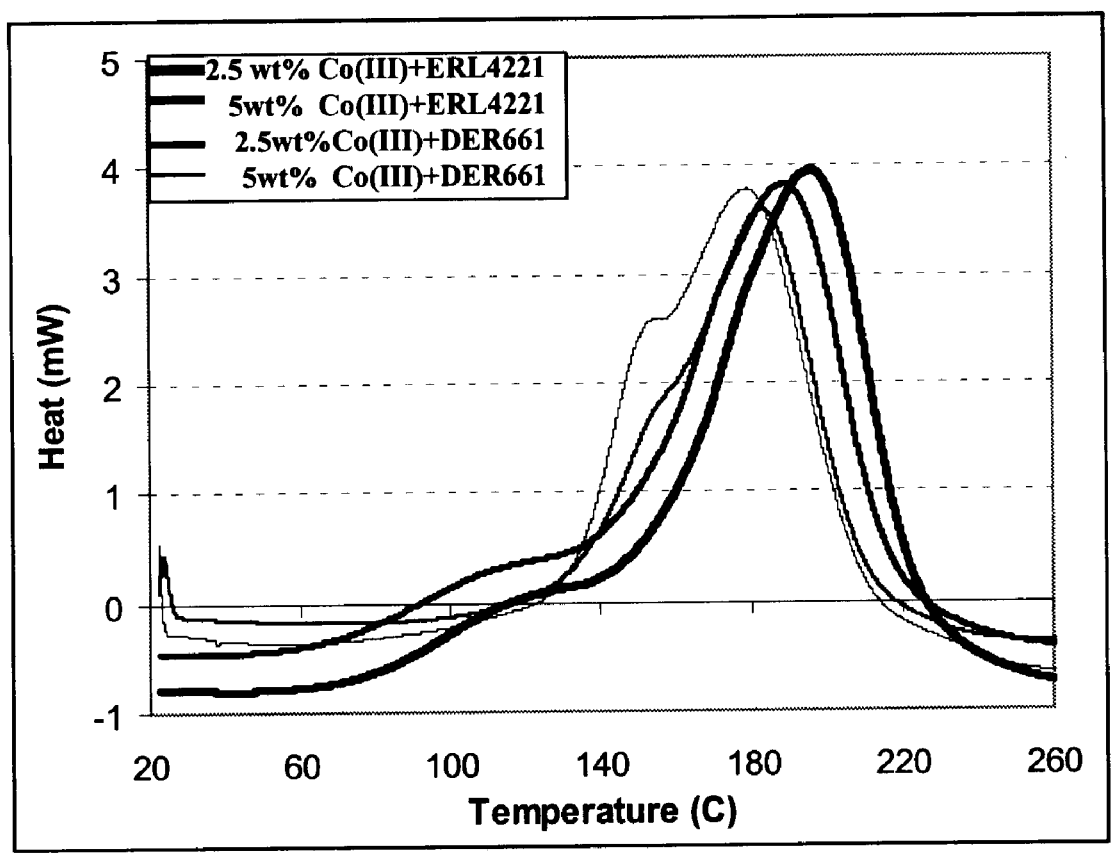
FIG. 10 is a graph showing the differential scanning calorimeter (DSC) curves of four different epoxy formulations. The graph shows the curing profile of the epoxy formulations.

FIG. 9 shows the thermogravimetric analysis (TGA) result of epoxy ERL-4221 with 5 wt % Co(II)-acac. It is clear that Co(II)-acac dissociates at 150° C. FIG. 10 shows the curing profile of four epoxy formulations from differential scanning calorimeter (DSC) analysis.

Table 4 lists the tested dielectric constants and loss factors of epoxy formulations and composites.

TABLE 4

Dielectric constant & loss factor (Tan δ) from electrical testing

| Material | Dielectric Constant | Tan δ |
|---|---|---|
| 2.5 wt % Co(II) + ERL 4221 | 3.6 | 0.017 |
| 5.0 wt % Co(II) + ERL 4221 | 4.0 | 0.014 |
| 2.5 wt % Co(III) + ERL 4221 | 3.9 | 0.017 |
| 5.0 wt % Co(III) + ERL 4221 | 5.0 | 0.015 |
| 2.5 wt % Co(III) + DER 661 | 4.6 | 0.015 |
| 5.0 wt % Co(III) + DER 661 | 6.4 | 0.016 |
| Composite (5 wt % Co(III)-ERL4221, 70 vl % Ceramic) | 98 | 0.017 |
| Composite (5 wt % Co(III)-ERL4221, 80 vl % Ceramic) | 89 | 0.022 |
| Composite (5 wt % Co(III)-DER661, 70 vl % Ceramic) | 110 | 0.016 |
| Composite (5 wt % Co(III)-DER661, 85 vl % PMN-PT/BaTiO$_3$) | 150 | n.d. |

Figure 11:
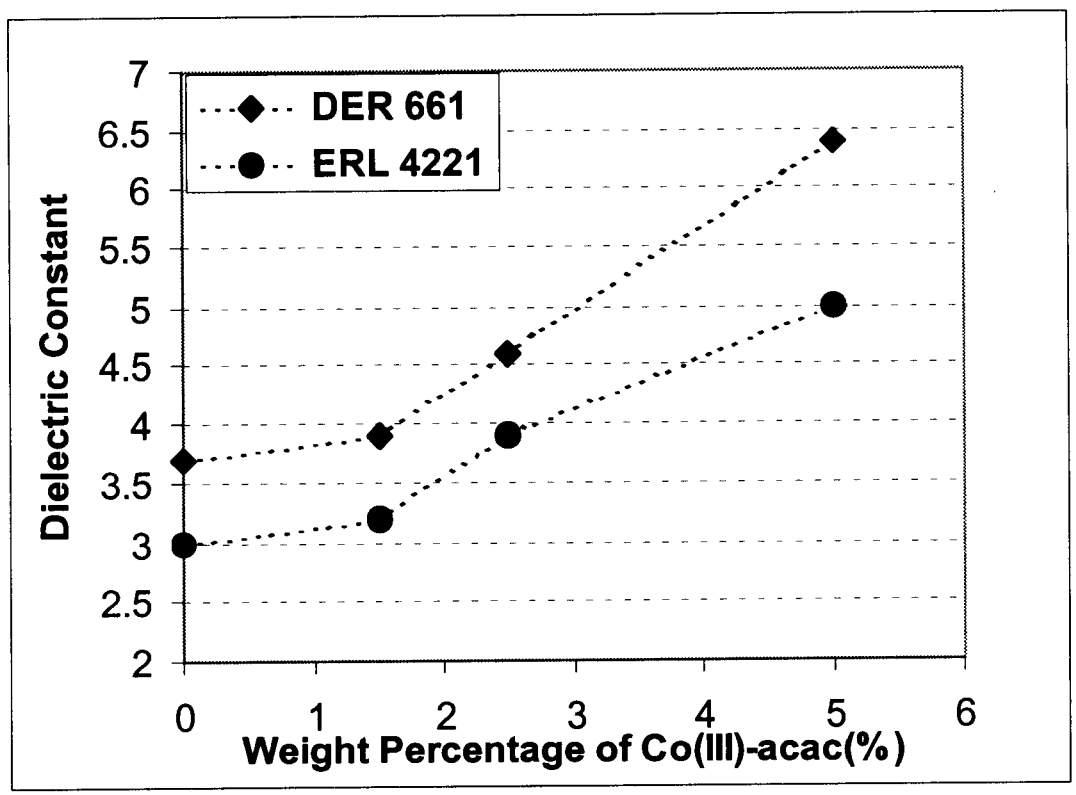
FIG. 11 is a graph comparing the dielectric constants of two different epoxy systems containing 0–5 wt % Co(III) acac.

Co(III) acac was found to have a stronger effect on the epoxy system than Co(II) acac, although all epoxy formulations with metal acac have higher dielectric constants than without the metal acac. FIG. 11 shows the effect of Co(III) acac to two epoxy systems, DER661 and ERL4221 at varying wt % Co(III).

The dielectric constant of composite using DER661 with 5 wt % Co(III)-acac and 70 vol. % ceramic loading was tested to be 110 (tested@ 10 Khz), which is a 50% increase compared over the reported value of 74 which was achieved using epoxy without a metal acetylacetonate. The dielectric constant of the composite using ERL4221 with 5 wt % Co(III)-acac and 70 vol. % ceramic loading was tested to be 98. However, the dielectric constant dropped to 89 for this composite with 80% volume ceramic loading. This drop may be due to the imperfect dispersing of ceramic particles at high packing density. Also, it is reported that high ceramic loading composite may include air in its structure which could account for the drop.

EXAMPLE 5

The metal acacs of the present invention have proven to be able to increase the dielectric constant of the selected epoxy systems. In particlular, 5 wt % Co(III) acac can increase the dielectric constant of the DER661 about 60%. Using this high dielectric constant epoxy as matrix, the composite with 70% volume ceramic loading obtained a dielectric constant of 98, which is 30% higher than previous reported composite. Prototypes of embedded capacitor with capacitance density of at least about 25 nF/cm2 have been demonstrated using this novel high dielectric constant composite.

The high K epoxy system developed using a Bispheol-A epoxy resin (DER 661 from Dow Chem.) and 5 wt % Co(III) acac's as curing catalyst was used to form composites. The dielectric constant of this high K epoxy was 6.4, which has 80% increase compared to the dielectric constant value of DER661 with the a non-metal acetylacetonate curing catalyst. Using this high K epoxy and the combination of two ceramic fillers: lead magnesium niobate-lead titanate (PMN-PT) and BaTiO$_3$. Polymer-ceramic composites were developed by the ball milling process. The average particle radius of PMN-PT and BaTiO$_3$ were 0.9 μm and 0.050 μm, respectively. The volume ratio of PMN-PT and BaTiO$_3$ was chosen as 4:1 in order to obtain high packing density. To achieve good dispersion of the ceramic fillers in the epoxy matrix, a phosphate ester (Byk-w 9010, Dow Chem.) was used as the surfactant. A sample Mo (composite-III) containing 85 vol % filler loading was ball milled for approximately 1 days at a speed of 220 r/min to obtain good particle dispersion. The viscosity of the sample was adjusted by the addition of solvents (NMP). In order to obtain the dielectric constant values for the epoxy system, prototype of embedded capacitors were fabricated. Capacitance measurements were taken using a HP 4263A LCR meter at 10 kHz. Dielectric constant values were calculated from the capacitance data using Equation 1. The dielectric constant of the composite-III was calculated as 150.

EXAMPLE 6

A set of electrical tests was conducted to characterize the high K epoxy-ceramic nano-composite, composite-III. The dielectric constant was measured in the frequency range from 10 kHz to 1.8 GHz by using a HP 4291A RF Impedance/Material Analyzer. Additionally, the leakage current was measured using a amperemeter by connecting the sample with two electric microprobes. An adjustable dc power supply was also used to measure the breakdown voltage of the composite. A programmable hot plate was used with the HP 4263A LCR meter to characterize the thermal tolerance of a typical capacitor, with the thickness of 3.75 μm. The thermal tolerance is defined as the relationship between the capacitance and the temperature. Finally, capacitance was measured for the same capacitor after 85/85 thermal humidity (TH) aging test.

Figure 12:
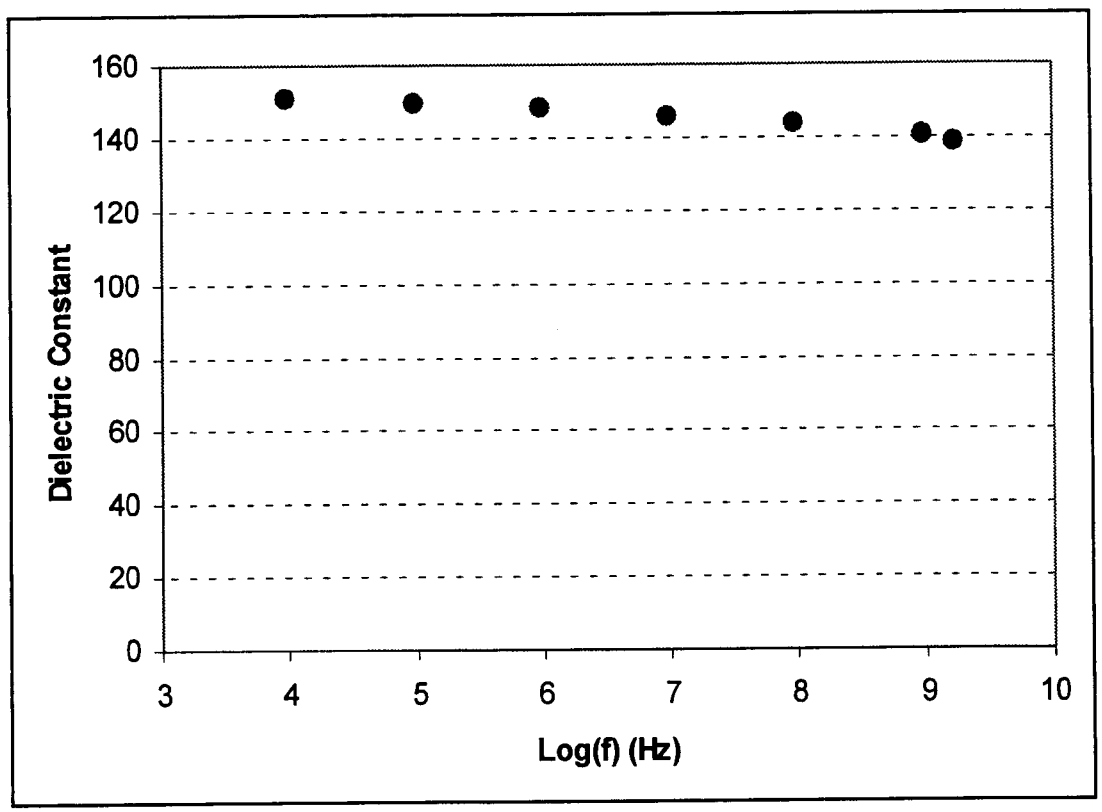
FIG. 12 is a graph showing the dielectric constant of a composite containing DER661 epoxy with 5 wt % Co(III) acac and two ceramic fillers, lead magnesium niobate-lead titanate and $BaTiO_3$ in a ratio of 4:1 at different frequencies.

FIG. 12 shows the dielectric constant of composite-III at different frequencies. It was found that the decrease of the dielectric constant was less than 10% from 10 kHz to 1.8 GHz. This outstanding feature of low loss makes the composite-I suitable for making the embedded decoupling capacitor for RF application.

Figure 13:
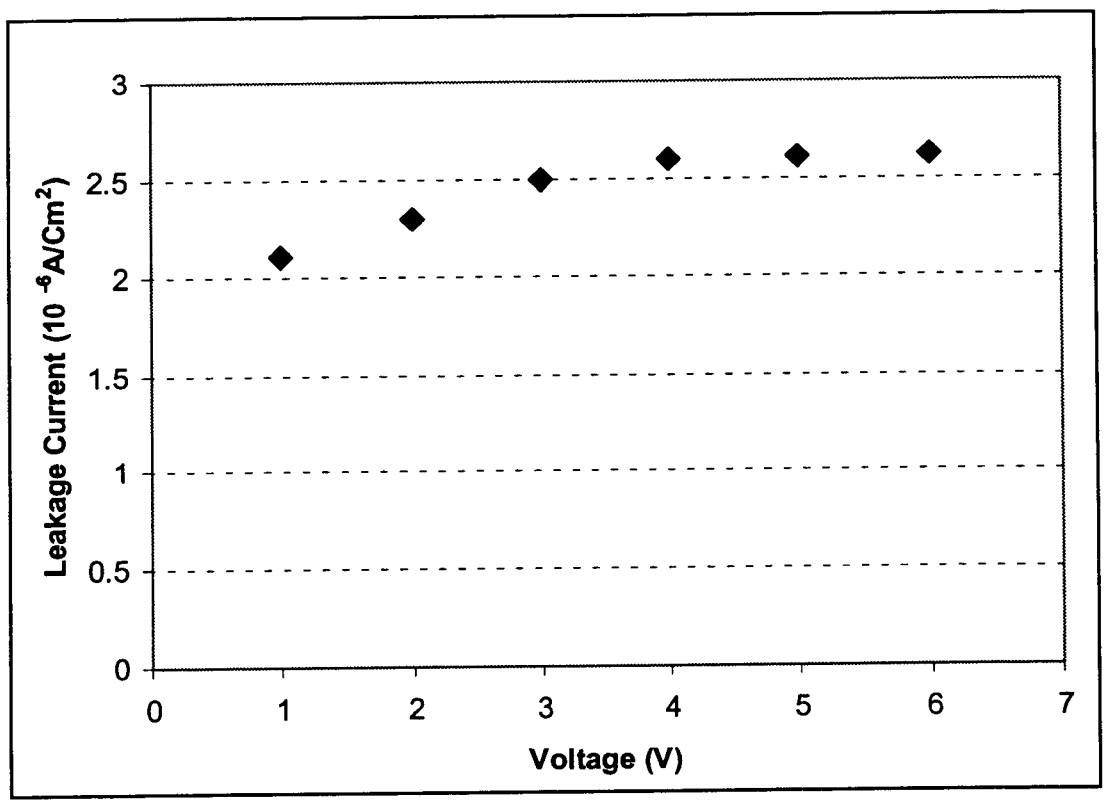
FIG. 13 is a graph showing the leakage current of a composite containing DER661 epoxy with 5 wt % Co(III) acac and two ceramic fillers, lead magnesium niobate-lead titanate and $BaTiO_3$ in a ratio of 4:1. The average particle radius was 0.9 µm and 0.050 µm respectively.

FIG. 13 shows the leakage current of the composite-I with the thickness of the material is 3.75 μm. The leakage current is less than 2.6 μA/cm2 under 6 V dc bias, and it will level off at higher dc bias. The leakage current of composite-I can fulfill the requirement of the embedded capacitor application.

Figure 14:
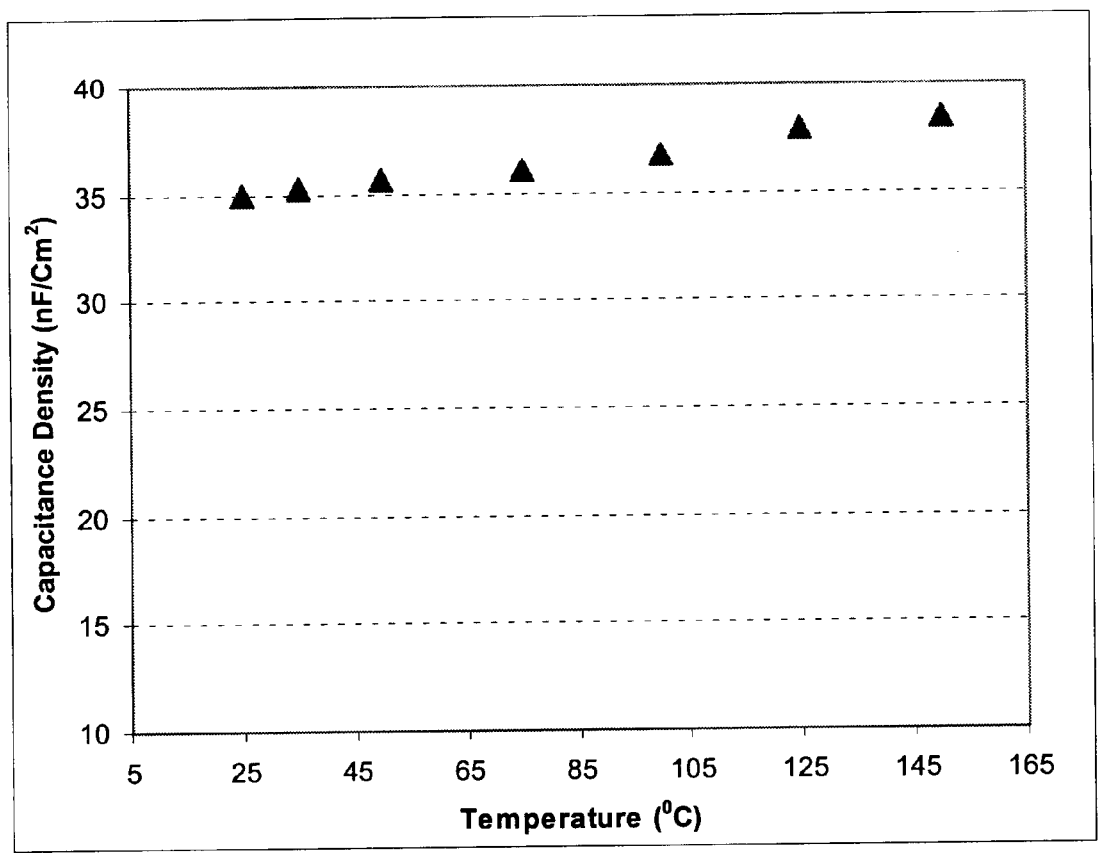
FIG. 14 shows the capacitance density change of an embedded capacitor prototype using composite-I as insulating material at different temperatures.

FIG. 14 shows the capacitance density change of an embedded capacitor prototype using composite-I as insulating material at different temperature. Basically, the dielectric constant increased from about 35 nF/cm$^2$ to 38.4 nF/cm$^2$ when the temperature changed from 25° C. to 155° C., which is an increase of less than 10%. However, it is hard to obtain the dielectric constant change according to thermal loading, because it is difficult to exclude the geometry change of the capacitor.

Figure 15:
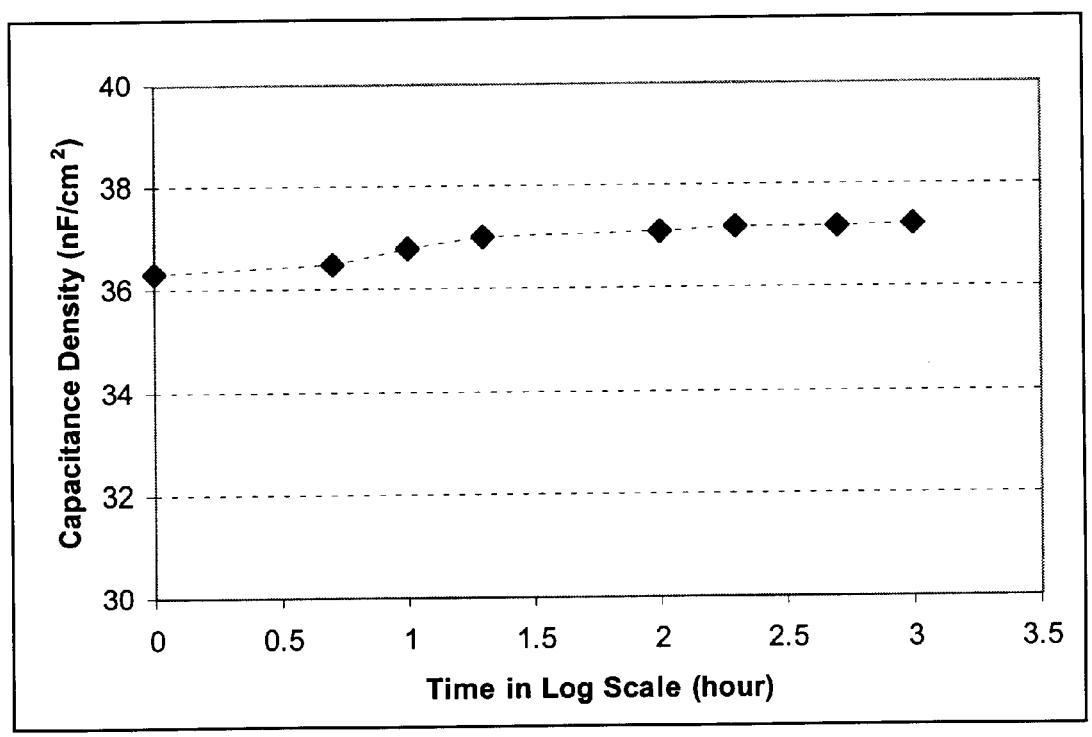
FIG. 15 is a line graph showing the capacitance density of an embedded capacitor prototype using composite-I as insulating material after certain times at 85/85 TH aging test.

FIG. 15 shows the capacitance density of the previous capacitor after certain times using the 85/85 TH aging test. It was found that the capacitance increased in the first 24 hours of the 85/85 TH aging test. After 24 hours, the capacitance did not change much. Moisture absorption may play an important role in the initial capacitance increase. Saturation generally occurs after 24 hours.

Figure 16:
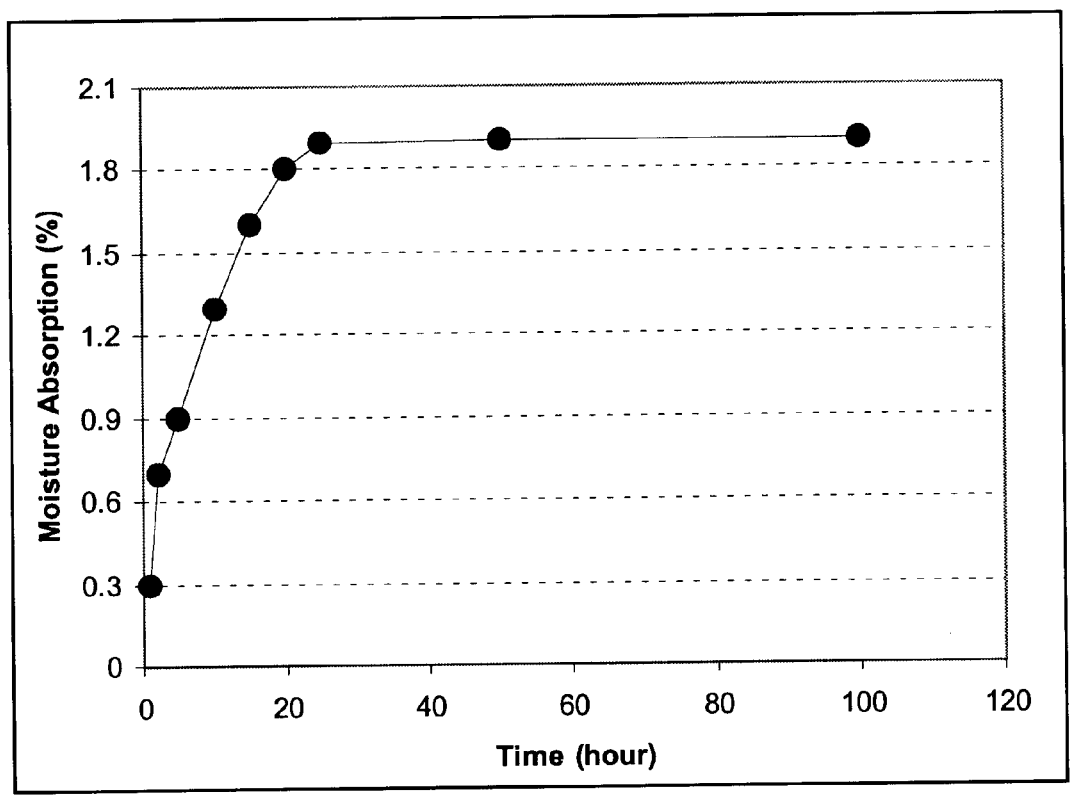
FIG. 16 is a line graph showing the moisture absorption of the composite-III under 85/85 condition, which proves the assumption. Because the total moisture absorption is less than 2%, the capacitance density increases 2.5% after 1000 hr at 85/85 TH aging test.

FIG. 16 shows the moisture absorption of the composite-III under the 85/85 condition. Because the total moisture absorption is less than 2%, the capacitance density increased 2.5% after 1000 hr during the 85/85 TH aging test. No electrical failure was observed during the 85/85 TH aging test.

The breakdown voltage of the composite-Ill measured higher than 1.7×107 V/m, which is high enough to be the insulating material for an embedded capacitor.

EXAMPLE 7

Figure 17:
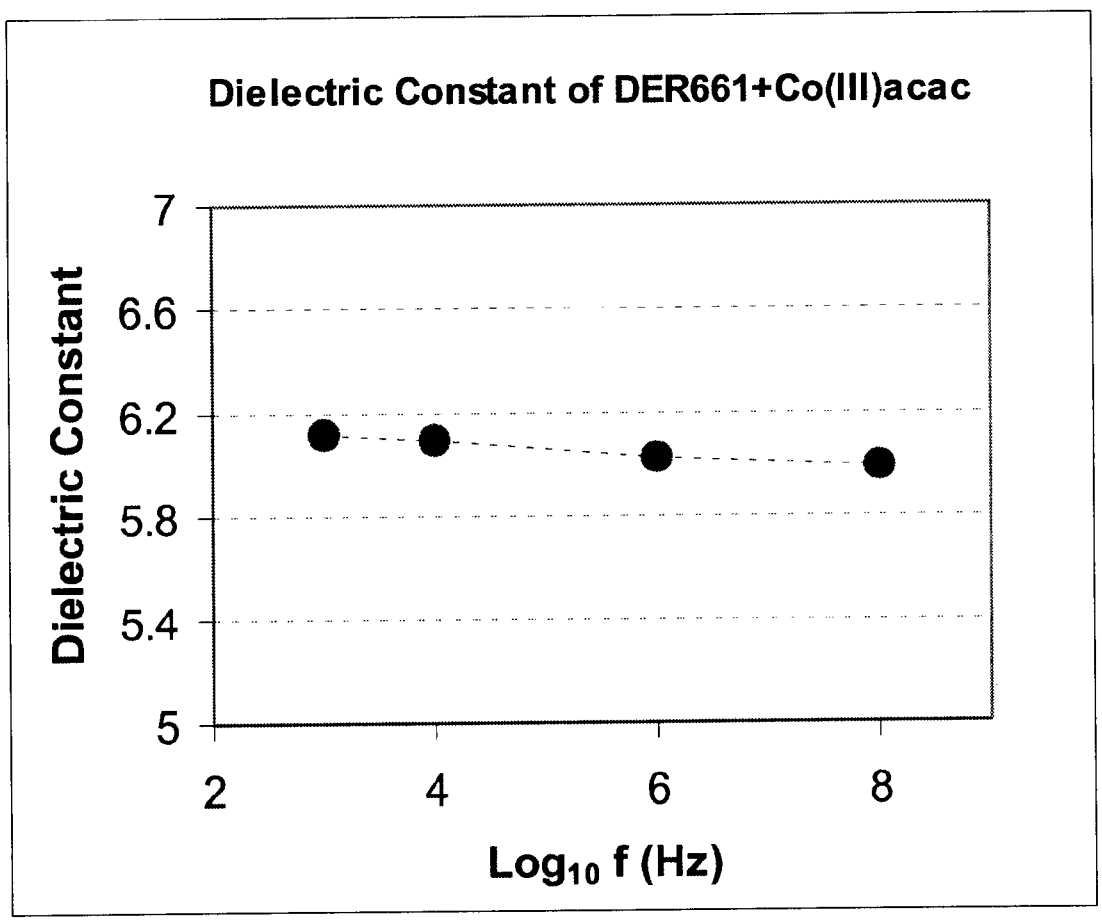
FIG. 17 is a line graph showing the change in dielectric constant with different frequencies for 5 weight percent metal acetylacetonate modified DER 661 and a 5 weight percent metal acetylacetonate modified DER 661 composite having 70 vl % ceramic loading
Figure 18:
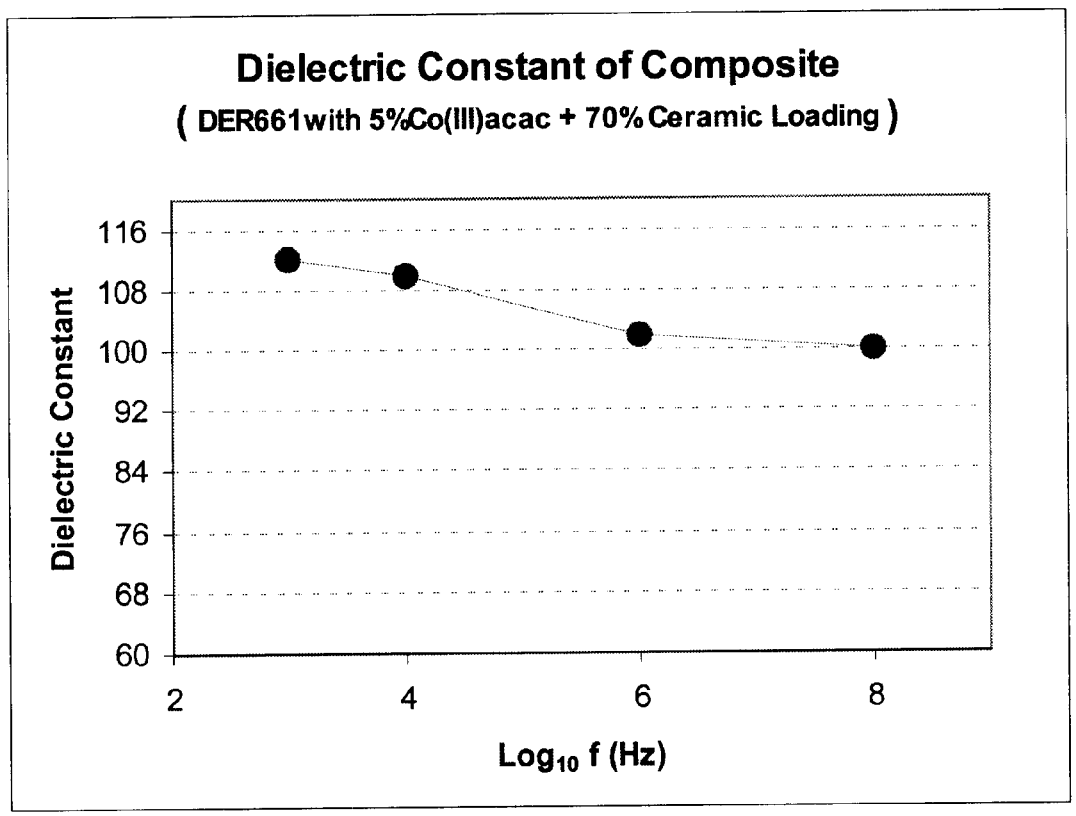
FIG. 18 is a line graph showing the change in dielectric constant with different frequencies for a 5 weight percent metal acetylacetonate modified DER 661 composite having 70 vl % ceramic loading.
Figure 19:
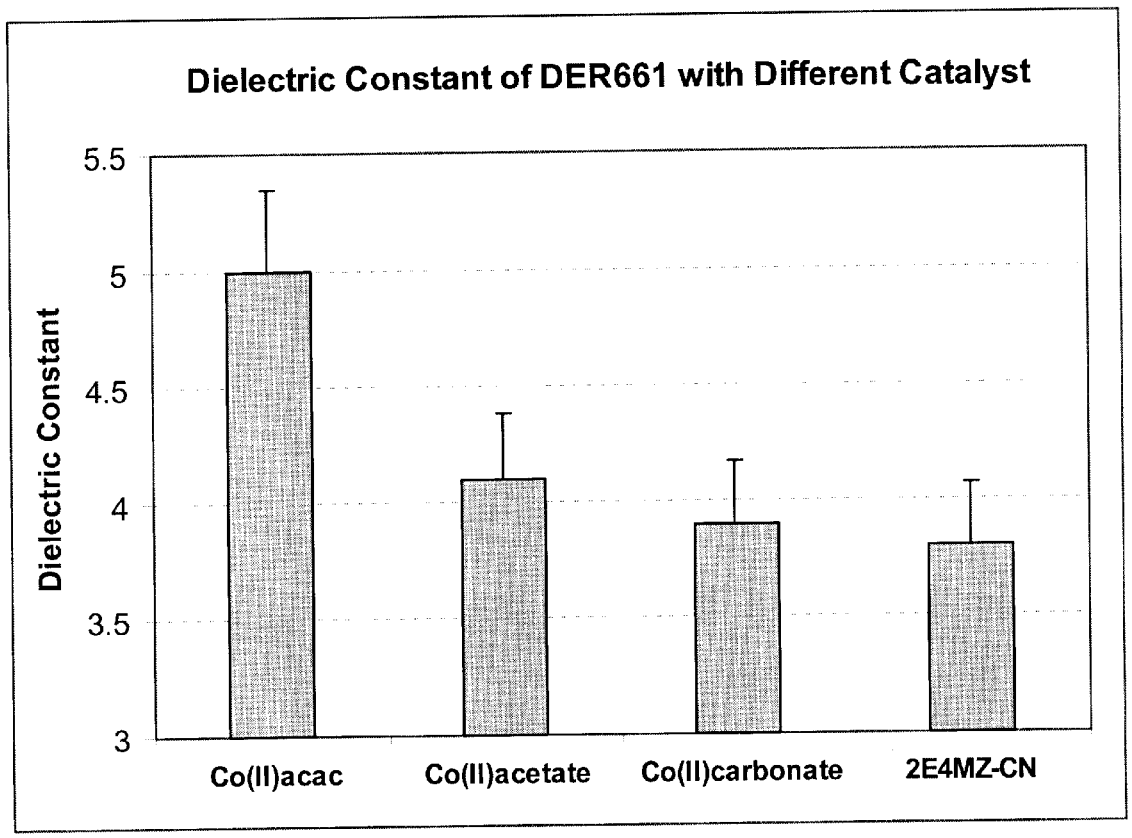
FIG. 19 is a line graph demonstrating the dielectric constant of DER661 cured using different catalysts: Co(II) acac, $CoCO_3$, Co-acetate and imidazole. Only Co(II)acac demonstrated a strong increase in the dielectric constant of the epoxy.

The dielectric constant change using different testing frequencies for 5 weight percent metal acetylacetonate modified DER 661 and a 5 weight percent metal acetylacetonate modified DER 661 composite having 70 vl % ceramic loading was observed (FIGS. 17 and 18). It was found that the dielectric constant decreased less than 10% from 1 kHz to 100 MHz. FIG. 19 compares the dielectric constant of DER661 cured using different catalysts: Co(II) acac, $CoCO_3$, Co-acetate and imidazole. It was found that of these catalysts, Co(II)acac showed the largest increase in the dielectric constant of the epoxy. Co(II)acac may provide longer, polar side groups that play a crucial role in polarity and increase the dielectric constant of the epoxy system.

EXAMPLE 8

The base polymer, 3,4-epoxycyclohexylmethyl-3,4-epoxycyclohexylcarboxylate (ERL-4221, from Union Carbide), epoxy resin and hexahydro-4-methylpthalic anhydride (HMPA, from Aldrich) hardener in a 1.0:0.8 mole ratio were used to form the epoxy system. This epoxy system has low viscosity that is helpful for high ceramic loading. The tested dielectric constant of this epoxy system is 3.0. Cobalt (II) actylacetonate and copper benzoyl acetonate (CBA) were added to the epoxy resin to increase the dielectric constant. The formulations were made by first dissolving a specific amount of the particular additive in warm epoxy resin (70–80° C.). Once the additive was completely dissolved, the mixture was cooled to room temperature. Lastly, the hardener was added and the mixture was heated again to 70–80° C. while being stirred to achieve a homogenous blend. Table 1 gives the list of epoxy formulations.

TABLE 5

Epoxy formulations

| Epoxy Formulation | Cure Peak Temp |
|---|---|
| 2.5 wt % Co acac | 184° C. |
| 5.0 wt % Co acac | 181° C. |
| 2.5 wt % CBA | 198° C. |
| 5.0 wt % CBA | 190° C. |

To obtain the dielectric constant values for the epoxy system, prototype capacitors were fabricated. Polymer-ceramic composites were developed using 5.0 wt % Co(II) acac epoxy formulation and two ceramic fillers: lead magnesium niobate-lead titanate (PMN-PT) and $BaTiO_3$. The average particle radius of PMN-PT and $BaTiO_3$ are 1 μm and 50 nm, respectively. The volume ratio of PMN-PT and $BaTiO_3$ was chosen as 3:1 in order to obtain high pack density. The powder was supplied by TAM Ceramics. Samples containing 70 and 80 vol % filler loading were ball milled for approximately 4 days to obtain good particle dispersion and avoid curing of the material. The dielectric constant of the composite was also measured using the same method as for the polymer. Table 6 lists the tested dielectric constants and loss factors of epoxy formulations and composites.

TABLE 6

Dielectric constant & loss factor (Tan δ) from electrical testing

| Material | Dielectric Constant | Tan δ |
|---|---|---|
| 2.5 wt % CBA | 3.6 | 0.017 |
| 5.0 wt % CBA | 4.0 | 0.016 |
| 2.5 wt % Co(II) | 4.2 | 0.016 |

TABLE 6-continued

Dielectric constant & loss factor (Tan δ) from electrical testing

| Material | Dielectric Constant | Tan δ |
|---|---|---|
| 5.0 wt % Co(II) | 4.6 | 0.016 |
| Composite (5 wt % Co-epoxy, 70 vl % Cermaic) | 89 | 0.017 |
| Composite (5 wt % Co-epoxy, 80 vl % Cermaic) | 82 | 0.02 |

Co(II) acac was found to have a stronger effect on epoxy system than CBA, although all epoxy formulations with metal acac have higher dielectric constant.

The dielectric constant of the composite with 70% volume ceramic loading was tested to be 89, which is 20% increase compared with a reported value of 74. The dielectric constant dropped to 82 for the composite with 80% volume ceramic loading. This may be due to the imperfect disperse of ceramic particles at high packing density. All materials have low dielectric loss, which is suitable for embedded capacitor application.

Various modifications may be made to the invention as described without departing from the spirit of the invention or the scope of the appended claims.

What is claimed is:

1. A polymer-ceramic composite comprising:
   (a) a base polymer containing a metal acetylacetonate dispersed therein; and
   (b) a ceramic filler;
   wherein the composite has a mean dielectric constant of at least 60 at a frequency of at least 10 kHz.

2. The polymer-ceramic composite of claim 1, wherein the base polymer is selected from the group consisting of an epoxy, a polyimide, and a cyanate ester and a combination thereof.

3. The polymer-ceramic composite of claim 2, wherein the epoxy is cycloaliphatic epoxy or bispheol-A epoxy.

4. The polymer-ceramic composite of claim 1, wherein the ceramic filler is lead magnesium niobate-lead titanate or $BaTiO_3$ or a combination thereof.

5. The polymer-ceramic composite of claim 1, wherein the composite contains about 30 to about 90 volume percent ceramic filler loading.

6. The polymer-ceramic composite of claim 1, wherein the ceramic filler is a combination of lead magnesium niobate-lead titanate and $BaTiO_3$ in a ratio of about 3:1 to 4:1.

7. The composition of claim 1, wherein said metal acetylacetonate is selected from the group consisting of a transition metal acetylacetonate, a lanthanide acetylacetonate, an actinide acetylacetonate, and a alkaline earth metal acetylacetonate or a combination thereof.

8. The polymer-ceramic composite of claim 1, wherein the metal acetylacetonate is cobalt(II) acetylacetonate or cobalt(III) acetylacetonate or a combination thereof.

9. The polymer-ceramic composite of claim 1, wherein the amount of metal acetylacetonate is from about 1 to about 5 weight percent.

10. The polymer-ceramic composite of claim 1, wherein the average particle radius of the ceramic filler is less than 1 μm.

11. The polymer-ceramic composite of claim 1, having a dielectric loss factor of less than about 0.02.

12. The composite of claim 1, wherein the dielectric constant is at least 98.

13. The composite of claim 1, wherein the dielectric constant is at least 110.

14. The composite of claim 1, wherein the dielectric constant is up to 150.

15. A polymer-ceramic composite comprising:
   (a) a base polymer containing a metal acetylacetonate dispersed therein; and
   (b) a ceramic filler;
   wherein the base polymer containing the metal acetylacetonate has a dielectric constant of at least 6 at a frequency of at least 10 kHz.

16. The polymer-ceramic composite of claim 15, wherein the base polymer is selected from the group consisting of an epoxy, a polyimide, and a cyanate ester and a combination thereof.

17. The polymer-ceramic composite of claim 15, wherein the amount of metal acetylacetonate is from about 1 to about 5 weight percent.

18. The polymer-ceramic composite of claim 15, having a dielectric loss factor of less than about 0.02.

19. A method for producing polymer-ceramic composites having high dielectric constants comprising the steps of:
   (a) heating the polymer resin containing a metal acetylacetonate such that the metal acetylacetonate breaks down releasing metal cartons;
   (b) adding a hardener; and
   (c) combining the polymer containing a metal acetylacetonate dispersed therein with at least one ceramic filler, wherein the polymer containing the metal acetylacetonate has a dielectric constant of at least 6 at a frequency of at least 10 kHz.

20. The method of claim 19, wherein the combination of the polymer and ceramic fill is accomplished by ball milling.

21. The polymer-ceramic composite produced by the method of claim 19.

22. An embedded capacitor, comprising:
   a silicon wafer having a first and second side, wherein the first side is coated with a first metal layer;
   a polymer-ceramic composite, wherein the composite has a dielectric constant of at least 60 at a frequency of at least 10 kHz and contains a metal acetylacetonate dispersed therein, the composite being layered over the first metal layer; and
   a second layer of metal at least partially covering the composite layer.

23. The embedded capacitor of claim 22, wherein the polymer-ceramic composite contains an epoxy and at least one ceramic filler.

24. The embedded capacitor of claim 23, wherein the epoxy is cycloaliphatic epoxy or bispheol-A epoxy.

25. The embedded capacitor of claim 23, wherein the ceramic filler is lead magnesium niobate-lead titanate or $BaTiO_3$ or a combination thereof.

26. The embedded capacitor of claim 25, wherein lead magnesium niobate-lead titanate and $BaTiO_3$ are in a ratio of at least 3:1.

27. The embedded capacitor of claim 25, wherein the capacitor has a capacitance density of at least 25 $nF/cm^2$.

28. The embedded capacitor of claim 22, wherein said metal acetylacetonate is selected from the group consisting of a transition metal acetylacetonate, a lanthanide acetylacetonate, an actinide acetylacetonate, and a alkaline earth metal acetylacetonate or a combination thereof.

29. The embedded capacitor of claim 22, wherein the metal acetylacetonate is cobalt(II) acetylacetonate or cobalt(III) acetylacetonate or a combination thereof.

* * * * *

UNITED STATES PATENT AND TRADEMARK OFFICE
CERTIFICATE OF CORRECTION

PATENT NO. : 6,544,651 B2
DATED : April 8, 2003
INVENTOR(S) : Ching-Ping Wong and Yang Rao It is certified that error appears in the above-identified patent and that said Letters Patent is hereby corrected as shown below:

<u>Column 17,</u>
Lines 21-32, should read as follows:
19. A method for producing polymer-ceramic composites having high dielectric constants comprising the steps of:

(a) heating the polymer resin containing a metal acetylacetonate such that the metal acetylacetonate breaks down releasing metal cations;

(b) adding a hardener; and (c) combining the polymer containing a metal acetylacetonate dispersed therein with at least one ceramic filler, wherein the polymer containing the metal acetylacetonate has a dielectric constant of at least 6 at a frequency of at least 10 kHz.

Signed and Sealed this

Ninth Day of March, 2004

JON W. DUDAS
*Acting Director of the United States Patent and Trademark Office*